United States Patent
Wu et al.

(10) Patent No.: US 10,116,418 B2
(45) Date of Patent: Oct. 30, 2018

(54) JOINT FOUNTAIN CODING AND NETWORK CODING FOR LOSS-TOLERANT INFORMATION SPREADING

(71) Applicant: University of Florida Research Foundation, Incorporated, Gainesville, FL (US)

(72) Inventors: Dapeng Oliver Wu, Gainesville, FL (US); Xin Li, Gainesville, FL (US); Kairan Sun, Gainesville, FL (US); Qiuyuan Huang, Gainesville, FL (US)

(73) Assignee: UNIVERSITY OF FLORIDA RESEARCH FOUNDATION, INCORPORATED, Gainesville, FL (US)

( * ) Notice: Subject to any disclaimer, the term of this patent is extended or adjusted under 35 U.S.C. 154(b) by 8 days.

(21) Appl. No.: 15/501,479

(22) PCT Filed: Aug. 7, 2015

(86) PCT No.: PCT/US2015/044333
§ 371 (c)(1),
(2) Date: Feb. 3, 2017

(87) PCT Pub. No.: WO2016/022982
PCT Pub. Date: Feb. 11, 2016

(65) Prior Publication Data
US 2017/0230144 A1    Aug. 10, 2017

Related U.S. Application Data

(60) Provisional application No. 62/035,267, filed on Aug. 8, 2014.

(51) Int. Cl.
*H03M 13/00* (2006.01)
*H04L 1/00* (2006.01)
(Continued)

(52) U.S. Cl.
CPC ........ *H04L 1/0058* (2013.01); *H03M 13/154* (2013.01); *H03M 13/3761* (2013.01); *H04L 1/08* (2013.01)

(58) Field of Classification Search
CPC ...... H04L 1/0058; H04L 1/08; H03M 13/154; H03M 13/3761
See application file for complete search history.

(56) References Cited

U.S. PATENT DOCUMENTS

| 5,404,353 A | 4/1995 | Ben-Michael et al. |
| 6,738,368 B1 | 5/2004 | Terry |
(Continued)

FOREIGN PATENT DOCUMENTS

| CN | 101567755 A | 10/2009 |
| CN | 102170332 B | 6/2013 |
(Continued)

OTHER PUBLICATIONS

International Search Report and Written Opinion for International Application No. PCT/US2017/022772 dated Jul. 7, 2017.
(Continued)

*Primary Examiner* — Esaw T Abraham
(74) *Attorney, Agent, or Firm* — Alston & Bird LLP

(57) ABSTRACT

A network system for increasing data throughput and decreasing transmission delay from a source node to a sink node via a relay node. The network system may comprise a source node configured to encode a plurality of data packets using rateless coding and transmit the plurality of data packets; at least one relay node configured to receive at least one of the plurality of data packets from the source node, and if the at least one relay node has received a sufficient quantity of the plurality of data packets, regenerate, re-encode, and relay the plurality of data packets; and a sink node configured to receive one or more of the plurality of
(Continued)

data packets from the at least one relay node, and if the sink node has received the sufficient quantity of the plurality of data packets, regenerate and decode the plurality of data packets.

19 Claims, 12 Drawing Sheets

(51) Int. Cl.
*H03M 13/37* (2006.01)
*H03M 13/15* (2006.01)
*H04L 1/08* (2006.01)

(56) References Cited

U.S. PATENT DOCUMENTS

| | | | | |
|---|---|---|---|---|
| 7,593,342 | B2* | 9/2009 | Molisch | H04B 7/026 370/238 |
| 7,924,761 | B1* | 4/2011 | Stevens | H03M 13/3761 370/315 |
| 7,944,871 | B2* | 5/2011 | Imamura | H04B 7/15542 370/315 |
| 8,203,979 | B2* | 6/2012 | Zhang | H04B 7/15592 370/315 |
| 8,275,322 | B2* | 9/2012 | Khojastepour | H04B 7/155 370/315 |
| 8,432,848 | B2* | 4/2013 | Mehta | H04B 7/15592 370/315 |
| 8,750,316 | B2 | 6/2014 | Conway | |
| 8,917,649 | B2* | 12/2014 | Sfar | H04B 7/15592 370/315 |
| 8,996,946 | B2* | 3/2015 | Wu | H03M 13/3761 714/752 |
| 9,350,683 | B2* | 5/2016 | Hui | H04L 49/20 |
| 9,490,940 | B2* | 11/2016 | Lilleberg | H04B 7/15592 |
| 9,571,178 | B2* | 2/2017 | Kim | H04L 1/0077 |
| 9,860,022 | B2* | 1/2018 | Krigslund | H04L 1/0076 |
| 2002/0067299 | A1 | 6/2002 | Clark et al. | |
| 2007/0177579 | A1 | 8/2007 | Diethorn et al. | |
| 2007/0280233 | A1 | 12/2007 | Bush | |
| 2008/0025323 | A1 | 1/2008 | Khan | |
| 2008/0310348 | A1 | 12/2008 | Nandagopalan et al. | |
| 2010/0046371 | A1 | 2/2010 | Sundararajan et al. | |
| 2011/0149835 | A1 | 6/2011 | Shimada et al. | |
| 2011/0170591 | A1 | 7/2011 | Li et al. | |
| 2012/0128009 | A1 | 5/2012 | Yang et al. | |
| 2012/0182860 | A1 | 7/2012 | Liu et al. | |
| 2012/0188934 | A1 | 7/2012 | Liu et al. | |
| 2012/0250494 | A1 | 10/2012 | Rong et al. | |
| 2013/0259041 | A1 | 10/2013 | Lucani et al. | |
| 2013/0322287 | A1 | 12/2013 | Bontu et al. | |
| 2015/0003825 | A1 | 1/2015 | Zhou | |
| 2015/0179183 | A1 | 6/2015 | Geiger et al. | |
| 2016/0021597 | A1 | 1/2016 | Hart et al. | |

FOREIGN PATENT DOCUMENTS

| | | |
|---|---|---|
| KR | 10-2011-0077648 A | 7/2011 |
| WO | WO 2011/044919 A1 | 4/2011 |
| WO | WO 2011/113200 A1 | 9/2011 |
| WO | WO 2014/074802 | 5/2014 |
| WO | WO 2016/022982 A1 | 2/2016 |

OTHER PUBLICATIONS

International Search Report and Written Opinion for International Application No. PCT/US17/22761 dated Jul. 13, 2017.
International Search Report and Written Opinion dated Oct. 28, 2015 for Application No. PCT/US2015/044333.
International Preliminary Report on Patentability dated Feb. 23, 2017 for Application No. PCT/US2015/044333.
International Search Report and Written Opinion dated Mar. 22, 2017 for Application No. PCT/US2016/067968.
International Search Report and Written Opinion dated May 11, 2017 for Application No. PCT/US2017/019345.
Invitation to Pay Additional Fees dated May 4, 2017 for Application No. PCT/US2017/022772.
[No Author Listed], QualNet Network Simulator Software. Scalable Network Technologies. 2008. http://web.scalable-networks.com/qualnet-network-simulator-software [last accessed Apr. 27, 2017]. 6 pages.
Aguajo et al., Link-level measurements from an 802.11 b mesh network. ACM SIGCOMM Computer Communication Review. 2004;34(4):121-32. 11 pages.
Ahlswede et al., Network information flow. IEEE Transactions on Information Theory. 2000;46(4):1204-16.
Chachulski et al., Trading structure for randomness in wireless opportunistic routing. Proceedings of ACM SIGCOMM. 2007. 12 pages.
Chou et al., Practical network coding. Proceedings of 41st Annual Allerton Conference on Communication, Control, and Computing. 2003. 10 pages.
Haeupler et al., One packet suffices-highly efficient packetized network coding with finite memory. Proceedings of IEEE International Symposium on Information Theory (ISIT). 2011;1151-5. 5 pages.
Haeupler, Analyzing network coding gossip made easy. Proceedings of ACM Symposium on Theory of computing (STOC). 2011;293-302.
Ho et al., The benefits of coding over routing in a randomized setting. Proceedings of IEEE International Symposium on Information Theory (ISIT). 2003. 6 pages.
Holland et al., Analysis of TCP performance over mobile ad hoc networks. Wireless Networks. 2002;8(2/3):275-88.
Katti et al., XORs in the air: practical wireless network coding. ACM SIGCOMM Computer Communication Review. 2006;(4):243-54. 12 pages.
Kim et al., Network Coded TCP (CTCP). arXiv preprint arXiv:1212.2291. 2012. 14 pages.
Krigslund et al., On the combination of multi-layer source coding and network coding for wireless networks. 2013 IEEE 18th International Workshop on Computer Aided Modeling and Design of Communication Links and Networks (CAMAD). Sep. 25-27, 2013. 6 pages.
Li et al., Linear network coding. IEEE Transactions on Information Theory. Feb. 2003;49(2):371-81.
Lin et al., Error control coding. Pearson Prentice-Hall: Upper Saddle River, NJ, 2nd edition. 2004. Table of Contents. 9 pages.
Lun et al., On coding for reliable communication over packet networks. Phys Comm. 2008;1(1):3-20.
Mandridis et al., A feedforward system for dynamic equalization of a chirped laser source suitable for photonic analog-to-digital conversion. Proc SPIE. 2009;7339:733904.1-12.
Ostovari et al., Chapter 1: Network Coding Techniques for Wireless and Sensor Networks. In "The Art of Wireless Sensor Networks". Dec. 14, 2013;129-62. 35 pages.
Park et al., Codecast: a network-coding-based ad hoc multicast protocol. IEEE Wireless Communications. 2006;13(5):76-81.
Qureshi et al., Optimal solution for the index coding problem using network coding over GF (2). IEEE Communications Society Conference on Sensor, Mesh and Ad Hoc Communications and Networks (SECON). 2012;209-17. 9 pages.
Qureshi et al., Primer and Recent Developments on Fountain Codes. arXiv preprint arXiv:1305.0918. May 4, 2013. 9 pages.
Rappaport, Wireless communications: principles and practice. Prentice-Hall: Upper Saddle River, NJ, 2nd edition. 2002. Table of Contents. 12 pages.
Rayanchu et al., Loss-aware network coding for unicast wireless sessions: design, implementation, and performance evaluation. ACM SIGMETRICS Performance Evaluation Review. 2008;(1):85-96. 12 pages.
Shokrollahi et al., Raptor Codes. Foundations and Trends in Communications and Information Theory. 2011;6(3-4):213-322.

(56) References Cited

OTHER PUBLICATIONS

Silva et al., Sparse network coding with overlapping classes. Proceedings of IEEE Workshop on Network Coding, Theory, and Applications (NetCod). 2009;74-9. 15 pages.

Wang et al., *Lava*: A reality check of network coding in peer-to-peer live streaming. IEEE INFOCOM. 2007;1082-90.

Wu et al., Information exchange in wireless networks with network coding and physical-layer broadcast. Technical report MSR-TR-2004-78. Microsoft Corporation, Redmond, WA. Aug. 2004. 7 pages.

Wu et al., Transporting real-time video over the Internet: Challenges and approaches. Proceedings of the IEEE. Dec. 2000;88(12):1855-75.

Wu, A trellis connectivity analysis of random linear network coding with buffering. IEEE International Symposium on Information Theory (ISIT), Seattle, USA. Jul. 9-14, 2006;768-72.

Yang et al., Batched Sparse Codes. arXiv:1206.5365v2. Feb. 6, 2014. 51 pages.

Yang et al., Coding for a network coded fountain. Proceedings of IEEE International Symposium on Information Theory (ISIT). 2011;2647-51.

International Search Report and Written Opinion dated May 25, 2017 for Application No. PCT/US2017/022719.

International Search Report and Written Opinion dated Jun. 12, 2017 for Application No. PCT/US2017/022715.

Invitation to Pay Additional Fees dated May 18, 2017 for Application No. PCT/US2017/022761.

\* cited by examiner

ALGORITHM 1 XOR ENCODING OF FUN-1

1: WHILE AT LEAST ONE FLOW (FORWARD OR BACKWARD FLOW) IS ALIVE DO
2:   IF LAYER 2.2 OUTPUT QUEUES FOR THE FORWARD FLOW AND THE BACKWARD FLOW BOTH HAVE AT LEAST ONE BATCH OF $M$ RE-CODED PACKETS, SAY, THE $i$-TH BATCH FOR THE FORWARD FLOW AND THE $j$-TH BATCH FOR THE BACKWARD FLOW THEN
3:     FOR $m = 1, \ldots, M$ DO
4:       PICK PACKET $y_{i,m}$ AT THE HEAD OF LAYER 2.2 OUTPUT QUEUE FOR THE FORWARD FLOW;
5:       PICK PACKET $\bar{y}_{j,m}$ AT THE HEAD OF LAYER 2.2 OUTPUT QUEUE FOR THE BACKWARD FLOW;
6:       $p_m = y_{i,m} \oplus \bar{y}_{j,m}$;
7:       PUT THE FOLLOWING IN THE HEADER OF PACKET $p_m$: 1) PACKET ID $m$, 2) THE MAC ADDRESS OF THE NEXT-HOP NODE OF PACKET $y_{i,m}$, 3) BATCH ID $i$ OF PACKET $y_{i,m}$, 4) THE MAC ADDRESS OF THE NEXT-HOP NODE OF PACKET $\bar{y}_{j,m}$, 5) BATCH ID $j$ OF PACKET $\bar{y}_{j,m}$, 6) LOCAL ENCODING VECTORS OF PACKETS $y_{i,m}$ AND $\bar{y}_{j,m}$;
8:       ENABLE THE BIT *FUN_XOR* IN THE HEADER OF PACKET $p_m$, I.E., *FUN_XOR* = 1;
9:       PLACE PACKET $p_m$ IN LAYER 2.1 OUTPUT QUEUE;
10:     END FOR
11:   ELSE
12:     IF LAYER 2.2 OUTPUT QUEUE OF ONE FLOW (FORWARD OR BACKWARD) HAS AT LEAST TWO BATCH OF $M$ RE-CODED PACKETS, SAY, THE $i$-TH BATCH BEING THE HEAD-OF-LINE BATCH THEN
13:       FOR $m = 1, \ldots, M$ DO
14:         PICK PACKET $y_{i,m}$ AT THE HEAD OF LAYER 2.2 OUTPUT QUEUE OF THE FLOW;
15:         DISABLE THE BIT *FUN_XOR* IN THE HEADER OF PACKET $y_{i,m}$, I.E., *FUN_XOR* = 0;
16:         PLACE PACKET $y_{i,m}$ IN LAYER 2.1 OUTPUT QUEUE;
17:       END FOR
18:     END IF
19:   END IF
20: END WHILE

FIG. 8

| ALGORITHM 2 XOR ENCODING OF FUN-1 |
|---|
| 1: WHILE AT LEAST ONE FLOW (FORWARD OR BACKWARD FLOW) IS ALIVE DO |
| 2:   IF THE HEAD-OF-LINE PACKET TO LAYER 2.2 INPUT QUEUE HAS $FUN\_XOR = 0$ THEN |
| 3:     MOVE THIS HEAD-OF-LINE PACKET TO LAYER 2.1 INPUT QUEUE; |
| 4:   ELSE |
| 5:     MOVE THIS HEAD-OF-LINE PACKET TO ITS CORRESPONDING QUEUE IN THE BUFFER OF LAYER 2.1 (EACH QUEUE IS UNIQUELY IDENTIFIED BY THE SAME SET OF RECEIVER MAC ADDRESSES IN THE PACKET HEADER); |
| 6:     IF A QUEUE IN THE BUFFER OF LAYER 2.1 HAS TWO BATCHES OF RECEIVED PACKETS (ASSUME THE HEAD-OF-LINE XOR-ED BATCH HAS BATCH ID $i$ FOR THE FORWARD FLOW AND BATCH ID $j$ FOR THE BACKWARD FLOW) THEN |
| 7:       WHILE THE HEAD-OF-LINE PACKET, SAY $p_m$, HAS ITS FORWARD-FLOW BATCH ID EQUAL $i$ DO |
| 8:         RECOVER THE PACKET OF THE FORWARD FLOW BY $y_{i,m} = p_m \oplus \bar{y}_{j,m}$, WHERE $\bar{y}_{j,m}$ IS A PACKET IN $\bar{Y}_{j,l-1} = \bar{Y}_j \bar{E}_{j,l-1} \bar{H}_{j,l-1}$, WHERE $l$ IS THE INDEX OF THE CURRENT NODE $R_l$, $l-1$ IS THE INDEX OF THE NEXT-HOP NODE $R_{l-1}$ OF THE BACKWARD FLOW, $\bar{Y}_{j,l-1}$ IS THE MATRIX WHOSE COLUMNS ARE CODED PACKETS, RE-CODED BY NODE $R_{l-1}$ FOR THE BACKWARD FLOW, $\bar{E}_{j,l-1}$ IS AN ERASURE MATRIX FOR THE ERASURE CHANNEL FROM NODE $R_l$ TO NODE $R_{l-1}$, $\bar{E}_{j,l-1}$ CAN BE OBTAINED BY NODE $R_l$ VIA THE GLOBAL ENCODING VECTOR IN FUN-1 PACKET HEADER, $\bar{H}_{j,l-1}$ IS THE TRANSFER MATRIX OF AN RLNC FOR THE $j$-TH BATCH AT NODE $R_{l-1}$ FOR THE BACKWARD FLOW, $\bar{H}_{j,l-1}$ CAN BE OBTAINED BY THE LOCAL ENCODING VECTORS IN FUN-1 PACKET HEADER; |
| 9:         RECOVER THE PACKET OF THE BACKWARD FLOW BY $\bar{y}_{j,m} = p_m \oplus y_{i,m}$, WHERE $y_{i,m}$ IS A PACKET IN $Y_{i,l+1} = Y_i E_{i,l+1} H_{i,l+1}$, WHERE $l$ IS THE INDEX OF THE CURRENT NODE $R_l$, $l+1$ IS THE INDEX OF THE NEXT-HOP NODE $R_{l+1}$ OF THE FOWARD FLOW, $Y_{i,l+1}$ IS THE MATRIX WHOSE COLUMNS ARE CODED PACKETS, RE-CODED BY NODE $R_{l+1}$ FOR THE FOWARD FLOW, $E_{i,l+1}$ IS AN ERASURE MATRIX FOR THE ERASURE CHANNEL FROM NODE $R_l$ TO NODE $R_{l+1}$, $E_{i,l+1}$ CAN BE OBTAINED BY NODE $R_l$ VIA THE GLOBAL ENCODING VECTOR IN FUN-1 PACKET HEADER, $H_{i,l+1}$ IS THE TRANSFER MATRIX OF AN RLNC FOR THE $j$-TH BATCH AT NODE $R_{l+1}$ FOR THE FORWARD FLOW, $H_{i,l+1}$ CAN BE OBTAINED BY THE LOCAL ENCODING VECTORS IN FUN-1 PACKET HEADER; |
| 10:     END WHILE |
| 11:     END IF |
| 12:   END IF |
| 13: END WHILE |

FIG. 9

| ALGORITHM 3 OUTER DECODING OF FUN-2 AT NODE $j$ ($j \in \{0,1\}$) |
|---|
| 1: WHILE NOT ALL NATIVE PACKETS DESTINED TO NODE $j$ ARE DECODED DO |
| 2:   IF THE RECEIVING QUEUE OF LAYER 2.2 IS COMPLETE THEN |
| 3:     PICK PACKETS OF THE SAME BATCH FROM THE HEAD OF THE RECEIVING QUEUE OF LAYER 2.2; |
| 4:     IF FUN-2 HEADER 2 IS NOT EMPTY THEN |
| 5:       IF THE DESTINATION IP ADDRESS IN FUN-2 HEADER 1 IS THAT OF NODE $j$ THEN |
| 6:         LET $i$ EQUAL THE BATCH ID IN FUN-2 HEADER 1 OF ANY PICKED PACKET; |
| 7:         LET $k$ EQUAL THE BATCH ID IN FUN-2 HEADER 2 OF ANY PICKED PACKET; |
| 8:         LET $H_{k,1-j}$ BE A MATRIX WHOSE COLUMNS ARE THE GLOBAL ENCODING VECTORS IN FUN-2 HEADER 2 OF ALL THE PICKED PACKETS; |
| 9:         LET $B_{k,1-j}$ BE A MATRIX WHOSE COLUMNS ARE NATIVE PACKETS OF THE $k$-TH BATCH, SENT FROM NODE $j$ TO NODE $1-j$; |
| 10:       ELSE |
| 11:         LET $i$ EQUAL THE BATCH ID IN FUN-2 HEADER 2 OF ANY PICKED PACKET; |
| 12:         LET $k$ EQUAL THE BATCH ID IN FUN-2 HEADER 1 OF ANY PICKED PACKET; |
| 13:         LET $H_{k,1-j}$ BE A MATRIX WHOSE COLUMNS ARE THE GLOBAL ENCODING VECTORS IN FUN-2 HEADER 1 OF ALL THE PICKED PACKETS; |
| 14:         LET $B_{k,1-j}$ BE A MATRIX WHOSE COLUMNS ARE NATIVE PACKETS OF THE $k$-TH BATCH, SENT FROM NODE $j$ TO NODE $1-j$; |
| 15:       END IF |
| 16:       LET $Y_{i,j}$ BE A MATRIX WHOSE COLUMNS ARE THE PAYLOADS OF ALL THE PICKED PACKETS; |
| 17:       COMPUTE $Y_{i,j} = Y_{i,j} - B_{k,1-j} H_{k,1-j}$ |
| 18:     ELSE |
| 19:       LET $i$ EQUAL THE BATCH ID IN FUN-2 HEADER 1 OF ANY PICKED PACKET; |
| 20:       LET $Y_{i,j}$ BE A MATRIX WHOSE COLUMNS ARE THE PAYLOADS OF ALL THE PICKED PACKETS; |
| 21:     END IF |
| 22:     DO OUTER DECODING IN THE SAME WAY AS BATS OUTER DECODING WITH INPUT PACKETS $Y_{i,j}$ |
| 23:   END IF |
| 24: END WHILE |

FIG. 10

| ALGORITHM 4 INNER ENCODING OF FUN-2 |
|---|
| 1: FOR j=0 TO 1 DO |
| 2:   INITIALIZE TWO BUFFERS FOR DESTINATION j, WHICH ARE DENOTED BY $F_{j,new}$ AND $F_{j,old}$; |
| 3: END FOR |
| 4: WHILE AT LEAST ONE FLOW (FORWARD OR BACKWARD FLOW) IS ALIVE DO |
| 5:   IF LAYER 3 OUTPUT QUEUE IS NOT EMPTY THEN |
| 6:     PICK PACKET $y_{i,m}$ AT THE HEAD OF LAYER 3 OUTPUT QUEUE; ASSUME THE DESTINATION OF PACKET $y_{i,m}$ IS j; |
| 7:     SWITCH (STATE OF BUFFERS $F_{j,new}$, $F_{j,old}$, $F_{1-j,old}$) |
| 8:     CASE BUFFER $F_{j,new}$ IS NOT COMPLETE: |
| 9:       INSERT $y_{i,m}$ TO THE m-TH POSITION OF BUFFER $F_{j,new}$; |
| 10:      IF BUFFER $F_{j,new}$ IS COMPLETE THEN |
| 11:        GO TO STEP 7; |
| 12:      END IF |
| 13:    CASE BUFFER $F_{j,new}$ IS COMPLETE AND BUFFER $F_{j,old}$ IS EMPTY AND BUFFER $F_{1-j,old}$ IS EMPTY: |
| 14:      MOVE ALL THE PACKETS IN $F_{j,new}$ TO $F_{j,old}$; |
| 15:      IF THE PACKETS IN $F_{j,old}$ WERE MIXED BEFORE THEN |
| 16:        APPLY RLNC TO ALL THE PACKETS IN $F_{j,old}$ AND GENERATE M RE-CODED PACKETS; |
| 17:        MOVE THE RE-CODED PACKETS TO THE UNICAST OUTPUT QUEUE OF LAYER 2; |
| 18:      END IF |
| 19:    CASE BUFFER $F_{j,new}$ IS COMPLETE AND BUFFER $F_{j,old}$ IS EMPTY AND BUFFER $F_{1-j,old}$ IS COMPLETE: |
| 20:      MOVE ALL THE PACKETS IN $F_{j,new}$ TO $F_{j,old}$; |
| 21:      IF THE PACKETS IN $F_{j,old}$ WERE MIXED BEFORE THEN |
| 22:        APPLY RLNC TO ALL THE PACKETS IN $F_{j,old}$ AND GENERATE M RE-CODED PACKETS; |
| 23:        MOVE THE RE-CODED PACKETS TO THE UNICAST OUTPUT QUEUE OF LAYER 2; |
| 24:      ELSE |
| 25:        APPLY RLNC TO ALL THE PACKETS IN $F_{j,old}$ AND $F_{1-j,old}$ AND GENERATE M RE-CODED PACKETS; |
| 26:        MOVE THE RE-CODED PACKETS TO THE BROADCAST OUTPUT QUEUE OF LAYER 2; |
| 27:      END IF |
| 28:    CASE BUFFER $F_{j,new}$ IS COMPLETE AND BUFFER $F_{j,old}$ IS COMPLETE AND BUFFER $F_{1-j,old}$ IS EMPTY: |
| 29:      APPLY RLNC TO ALL THE PACKETS IN $F_{j,old}$ AND GENERATE M RE-CODED PACKETS; |
| 30:      MOVE THE RE-CODED PACKETS TO THE UNICAST OUTPUT QUEUE OF LAYER 2; |
| 31:      MOVE ALL THE PACKETS IN $F_{j,new}$ TO $F_{j,old}$; |
| 32:      IF THE PACKETS IN $F_{j,old}$ WERE MIXED BEFORE THEN |
| 33:        APPLY RLNC TO ALL THE PACKETS IN $F_{j,old}$ AND GENERATE M RE-CODED PACKETS; |
| 34:        MOVE THE RE-CODED PACKETS TO THE UNICAST OUTPUT QUEUE OF LAYER 2; |
| 35:      END IF |
| 36:    END SWITCH |
| 37:    IF $y_{i,m}$ HAS NOT BEEN INSERTED INTO $F_{j,new}$ THEN |
| 38:      INSERT $y_{i,m}$ TO THE i-TH POSITION OF $F_{j,new}$; |
| 39:    END IF |
| 40:   END IF |
| 41: END WHILE |

FIG. 11

JOINT FOUNTAIN CODING AND NETWORK CODING FOR LOSS-TOLERANT INFORMATION SPREADING

RELATED APPLICATIONS

The present application is a U.S. National Stage application under 37 U.S.C. § 371 based on International Application No. PCT/US2015/044333, filed on Aug. 7, 2015, which claims the benefit under 35 U.S.C. § 119(e) of U.S. Provisional Patent Application Serial No. 62/035,267, filed on Aug. 8, 2014, entitled "JOINT FOUNTAIN CODING AND NETWORK CODING FOR LOSS-TOLERANT INFORMATION SPREADING," which applications are hereby incorporated herein by reference in their entireties.

BACKGROUND

Information spreading plays a central role in human society. In the information age, how to efficiently and reliably spread information with low delay may be critical for numerous activities involving humans and machines, e.g., the spread of tweets in Twitter, the dissemination of data collected by wireless sensor networks, and delivery of Internet TV. With information spreading over lossy communication channels (also known as erasure channels), a problem exists wherein packets may be lost/discarded due to bit errors or buffer overflow. For wired networks over optical fiber channels, the bit error rate can be as low as $10^{-12}$, and so packet loss is mainly due to overflow of the buffers at routers rather than bit errors. For wireless channels, packet loss is mainly due to uncorrectable bit errors, which may be caused by fading, shadowing, interference, path loss, noise, etc. [17]. At the transmitter, most physical layer schemes encode messages by both an error-detecting code such as cyclic redundancy check (CRC) and an error-correction code. At the receiver, a received packet is first decoded by the error-correction decoder. If the resulting packet has uncorrectable bit errors, it will not pass the check of the error-detecting module. Most physical layer designs will drop those packets that have uncorrectable bit errors.

To address the packet loss problem, three approaches can be used [12, 22]. The first approach is retransmission or Automatic Repeat reQuest (ARQ). The Transmission Control Protocol (TCP) uses ARQ for packet loss recovery. An advantage of ARQ is its adaptation to time-varying channel condition (e.g., network congestion status or signal-to-interference-plus-noise ratio (SINR)) in the following manner: when the channel condition is very good (e.g., no congestion or very high SINR) and induces no packet loss, no retransmission is needed; the poorer the channel condition, the more lost packets, resulting in more retransmitted packets. Hence, ARQ is suitable for the case that the transmitter has little knowledge of the channel condition. A disadvantage of ARQ is that it is not suitable for reliable multicast communication due to the feedback implosion problem.

The second approach is Forward Error Correction (FEC). FEC is achieved by channel coding, which includes Reed-Solomon codes, convolutional codes, turbo codes, Low-Density Parity-Check (LDPC) code, and fountain codes (or rateless codes). FEC is suitable for the case in which the transmitter has good knowledge of SINR of the channel; in this case, the transmitter chooses a channel code with appropriate code rate (which depends on network congestion status or the SINR) so that the receiver can recover all the native packets without retransmission. If the transmitter has little knowledge of the channel condition, it does not know how much redundancy (parity bits) should be added to the coded packets: adding too much redundancy wastes communication resource while adding too little redundancy makes lost packets unrecoverable by the receiver. Another advantage of FEC is that it is well suited for reliable multicast applications since FEC does not need feedback and hence does not suffer from the feedback implosion problem like ARQ.

The third approach is hybrid ARQ, which combines certain features of ARQ and FEC. Under hybrid ARQ, the transmitter does not need to have knowledge of the channel condition. For non-erasure error-prone channels, there are two types of hybrid ARQ: Type I and Type II. Under Type I hybrid ARQ, the transmitter transmits a coded packet with error correction and error detection capability; if a packet has uncorrectable errors, the receiver sends a retransmission request to the transmitter and the transmitter transmits another coded packet.

Under Type II hybrid ARQ, the transmitter first transmits a coded packet with error detection capability only. If the packet has errors, the receiver sends a retransmission request and the transmitter transmits a new coded packet. Combining the previously coded packet and the newly coded packet forms a longer codeword, which has better error correction capability than a single packet. The receiver jointly decodes the previously received packet and newly received packet. If the errors are still uncorrectable, the receiver sends another retransmission request, and this process continues until the errors are corrected.

However, Type I and Type II hybrid ARQ are not suitable for erasure channels since lost packets cannot be treated as correctable errors in received packets. For erasure channels, the transmitter can use a fountain code and keep transmitting coded packets until the receiver is able to decode all the native packets of a file or a batch (here, a batch is a group of native packets, specified by a user or an application). The transmitter does not need knowledge of the channel condition, and it is able to adapt to the channel condition. Since a fountain code has no fixed code rate, it is called rateless code and is well suited for time-varying wired/wireless channel conditions and multicast applications with heterogeneous receivers. Network coded TCP (CTCP) [10] can be regarded as a hybrid ARQ approach for erasure channels.

Related Work

Erasure Codes

Packets may be dropped due to 1) congestion at a router or 2) uncorrectable bit errors, which may be caused by fading, shadowing, interference, path loss, or noise in a wireless channel. The packet loss rate in some real-world wireless networks can be as high as 20-50% [1].

Erasure codes can be used to recover native packets without feedback and retransmission. Under linear erasure coding, the coded packets are generated by linearly combining the native packets with coefficients from a finite field (Galois field) $\mathbb{F}_q$, where $q=2^i$ ($i \in \mathbb{N}$) and $\mathbb{N}$ is the set of natural numbers (i.e., positive integers). Erasure codes can be nonlinear [16] (for example, triangular codes [15]). A nonlinear erasure code can reduce the computational complexity by using only binary addition and shift operations instead of more complicated finite field multiplications as in a linear erasure code. Hence, nonlinear erasure codes may be particularly suited for mobile phone applications, which require low computational complexity and low power consumption.

Under an erasure code, a receiver can recover K native packets from n coded packets (received by the receiver), where $n=(1+\varepsilon)K$ and $\varepsilon$ can be very small, e.g., $\varepsilon$ can be as small as $10^{-6}$ for RQ codes [19]. To recover the K native packets, it does not matter which packets the receiver has received; as long as it has received any K linearly independent packets, the receiver is able to decode the K native packets. FIG. 2 illustrates an exemplary erasure channel and erase channel coding.

Erasure codes include Reed-Solomon codes, LDPC codes, and fountain codes [16]. According to [19], an erasure code can be classified as a fountain code if it has the following properties:

(Ratelessness) The number of coded packets that can be generated from a given set of native packets should be sufficiently large. The reason why this code is called fountain code is because the encoder generates an essentially unlimited supply of codewords, in analogy to a water fountain, which produces essentially unlimited drops of water [16].

(Efficiency and flexibility) Irrespective of which packets the receiver has received, the receiver should be able to decode K native packets using any K linearly independent received coded packets. Just like an arbitrary collection of water drops will fill a glass of water and quench thirst, irrespective of which water drops had been collected, a collection of any K linearly independent fountain-coded packets will be sufficient for the receiver to decode K native packets [16].

(Linear complexity) The encoding and decoding computation cost should be a linear function of the number of native packets K.

Network Coding

Simply forwarding packets may not be an optimal operation at a router from the perspective of maximizing throughput. Network coding was proposed to achieve maximum throughput for multicast communication [2]. Network coding techniques can be classified into two categories: intra-session (where coding is restricted to the same multicast or unicast session) [2, 7, 11] and inter-session (where coding is applied to packets of different sessions) [9, 18, 24]. The pioneering works on intra-session network coding include [2, 7, 11]; all these intra-session network coding techniques apply to multicast only. In [2], Ahlswede et al. showed that in a single-source multicast scenario, instead of simply forwarding the packets they receive, relay nodes can use network coding—i.e., mixing packets destined to different destinations—to achieve multicast capacity, which is higher than that predicted by the max-flow-min-cut theorem. In [11], Li et al. proved that linear network coding is enough to achieve the multicast capacity for many cases. In [7], Ho et al. introduced random linear network coding for a distributed implementation of linear network coding with low encoding/decoding cost. Examples of inter-session network coding schemes include [6, 9, 18, 24].

For wireless communication, cross-next-hop network coding [9, 18] and intra-session network coding [13, 25, 26] are often used. Under cross-next-hop network coding, a relay node applies coding to packets destined to different next-hop nodes. Cross-next-hop network coding is a special type of inter-session network coding. Cross-next-hop network coding uses per-next-hop queueing at each relay node while inter-session network coding may use per-flow queueing at each relay node or add a very large global encoding vector to the header of each coded packet [6]. Hence, cross-next-hop network coding is more scalable than a general inter-session network coding. As such, for core routers, it may be desirable to use cross-next-hop network coding instead of a general inter-session network coding.

Cross-next-hop network coding has been heavily studied in the wireless networking area. The major works include [9, 18]. In [9], Katti et al. proposed an opportunistic network coding scheme for unicast flows, called COPE, which can achieve throughput gains from a few percent to several folds depending on the traffic pattern, congestion level, and transport protocol. In [18], Rayanchu el al. developed a loss-aware network coding technique for unicast flows, called CLONE, which improves reliability of network coding by transmitting multiple copies of the same packet, similar to repetition coding [12].

Intra-session network coding has been used in combination with a random linear erasure code for unicast/multicast communication in [13, 25, 26]. Note that intra-session network coding should not be used alone at relay nodes (without the aid of erasure coding/decoding at the source/destination); otherwise, the performance will be very poor, i.e., the source needs to send much more redundant (duplicate) packets for the receiver to recover all the native packets, compared to joint erasure coding and intra-session network coding.

Joint Erasure Coding and Intra-Session Network Coding (JEN) and BATched Sparse (BATS)

The following Joint Erasure coding and intra-session Network coding (JEN) approach has been used for unicast/multicast communication in [13]: The source node uses random linear erasure coding (RLEC) to encode the native packets and add a global encoding vector to the header of each coded packet. A relay node uses random linear network coding (RLNC) to re-code the packets it has received (i.e., the relay node generates a coded packet by randomly linearly combining the packets that it has received and stored in its buffer); the relay node also computes the global encoding vector of the re-coded packet and adds the global encoding vector to the header of the re-coded packet. A destination node can decode and recover K native packets as long as it receives enough coded packets that contain K linearly independent global encoding vectors. Note that under the JEN approach, a relay node does not decode the packets received by this relay node; packets are only decoded by the destination node. Hence, JEN takes an end-to-end erasure coding approach, which is different from the hop-by-hop erasure coding approach that applies erasure encoding and decoding to each link/hop. It has been proved that JEN can achieve the multicast capacity for lossy networks in a wide range of scenarios [13, 23].

JEN has two control parameters: density and non-aggressiveness [21]. The ratio of the number of non-zero entries in the encoding vector to the total number of entries in the encoding vector is called the density of the code. Lower density corresponds to less computational complexity, but it also corresponds to a lower network-coding-gain. The ratio of the number of packets participating in computing a coded packet at a relay node to the total number of packets transmitted by the source node, is called non-aggressiveness (or patience) of the relay node. The smaller the value of non-aggressiveness/patience, the more aggressive the relay node is (or the less patient the relay node is). In other words, the relay node waits for a shorter time in buffering incoming packets for RLNC, which translates to a smaller end-to-end delay. Still, the smaller value of non-aggressiveness may result in a lower network-coding-gain since less packets participate in computing a coded packet.

In practice, under JEN, the data to be transmitted is partitioned into multiple segments [21] (or generations [4], blocks [14], or batches [3]), and coding is restricted within the same segment. In doing so, the encoding vector is small enough to be put into the header of a coded packet. Silva et al. proposed a network coding technique with overlapping segments [20] to improve the performance of JEN with non-overlapping segments.

BATched Sparse (BATS) codes have also been proposed [25, 26]. A BATS code consists of an inner code and an outer code over a finite field $\mathbb{F}_q$. The outer code is a matrix generalization of a fountain code. At a source node, the outer code encoder encodes native packets into batches, each of which contains M packets. When the batch size M is equal to 1, the outer code reduces to a fountain code. The inner code is an RLNC performed at each relay node. At each relay node, RLNC is applied only to the packets within the same batch of the same flow; hence the structure of the outer code is preserved.

Specifically, for unicast, a BATS coding approach works as follows. The source node uses a matrix-form fountain code as its outer code, where the matrix consists of a batch of M packets and each column of the matrix corresponds to a packet—in contrast to the original fountain code [19], which uses a vector form (i.e., a packet consisting of multiple symbols), and to JEN, which uses a RLEC—to encode the native packets and add an encoding vector of $M \times \log_2 q$ bits to the header of each coded packet (where q is the size of the finite field of the coding coefficients). A relay node uses RLNC to re-code all the received packets of the same batch, i.e., the relay node generates M coded packets by randomly linearly combining all the packets that it received for the same batch. The relay node also computes the encoding vector of the re-coded packet and adds the encoding vector to the header of the re-coded packet. A destination node can decode and recover K native packets as long as it receives enough coded packets.

SUMMARY

Some aspects include a network system for increasing data throughput and decreasing transmission delay from a source node to a sink node via a relay node. The network system may comprise a source node configured to encode a plurality of data packets using rateless coding and transmit the plurality of data packets; at least one relay node configured to receive at least one of the plurality of data packets from the source node, and if the at least one relay node has received a sufficient quantity of the plurality of data packets, regenerate, re-encode, and relay the plurality of data packets; and a sink node configured to receive one or more of the plurality of data packets from the at least one relay node, and if the sink node has received the sufficient quantity of the plurality of data packets, regenerate and decode the plurality of data packets.

Further aspects include a method for increasing data throughput and decreasing transmission delay from a source node to a sink node via a relay node. The method may comprise receiving, from at least one source node, at least one of a plurality of data packets encoded by the at least one source node using fountain coding; and if a sufficient quantity of the plurality of data packets are received, regenerating, re-encoding, and relaying the plurality of data packets to a sink node for regenerating and decoding of the plurality of data packets.

Additional aspects include at least one computer-readable storage medium encoded with executable instructions that, when executed by at least one processor, cause the at least one processor to perform a method for increasing data throughput and decreasing transmission delay from a source node to a sink node via a relay node. The method may comprise receiving, from at least one source node, at least one of a plurality of data packets encoded by the at least one source node using fountain coding; and if a sufficient quantity of the plurality of data packets are received, regenerating, re-encoding, and relaying the plurality of data packets to a sink node for regenerating and decoding of the plurality of data packets.

BRIEF DESCRIPTION OF THE DRAWINGS

FIG. 8 is an exemplary algorithm for XOR encoding according to some embodiments.

FIG. 9 is an exemplary algorithm for XOR decoding according to some embodiments.

FIG. 10 is an exemplary algorithm for outer decoding according to some embodiments.

FIG. 11 is an exemplary algorithm for inner encoding according to some embodiments.

DETAILED DESCRIPTION

Figure 1:
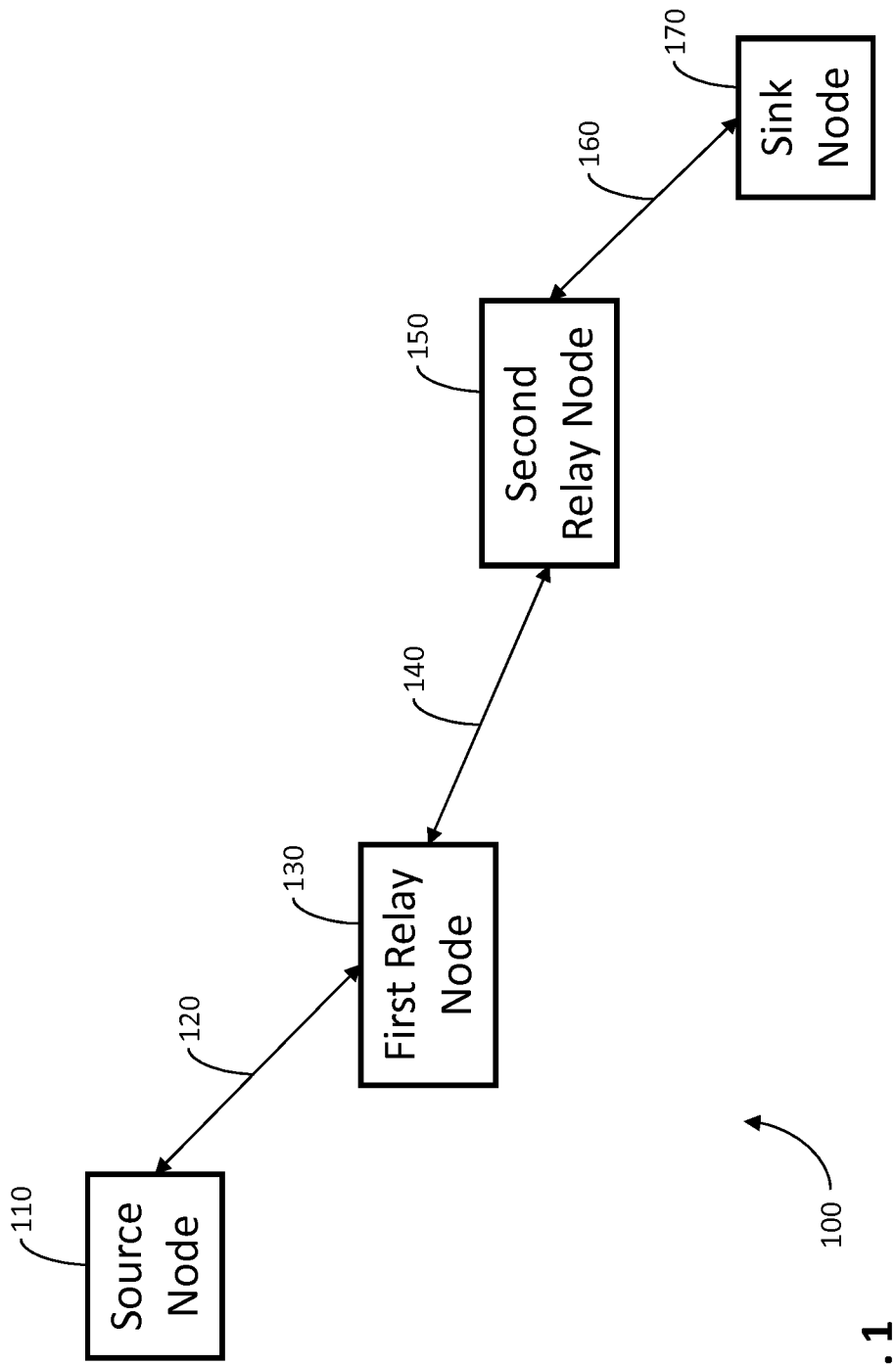
FIG. 1 is a block diagram illustrating an exemplary source node, relay nodes, and a sink (or destination) node of a network in which some embodiments of the application may be implemented.

The inventors have recognized and appreciated that higher data throughput (rate of successful message delivery over a communication channel) and lower delay than other network coding methods for uncoordinated transmitting of the same data from multiple sources to one destination may be achieved with a method of Forward Error Correction (FEC), referred to herein as joint FoUntain coding and Network coding (FUN). Under the FUN coding approach, each source node may use a fountain code to encode information packets (native packets); each intermediate node (or a relay node) may use intra-session network coding to re-code the packets in the same batch of the same session received from the upstream node, and, if possible, may use cross-next-hop network coding to re-code packets destined to different next-hop nodes; a sink or destination node may decode the coded packets on the fly, and may be able to reconstruct all the native packets as long as it receives a sufficient number of coded packets to perform the reconstruction of the native packets. A "sufficient" number of coded packets may be assessed based on a fixed threshold. Alternatively or additionally, a "sufficient" number may be a dynamically established threshold. Herein, a unicast session may be identified by a unique source/destination IP address pair while a multicast session may be identified by a tuple of the source IP address and all the multicast receiver IP addresses.

Comparisons

Joint Erasure Coding and Intra-Session Network Coding (JEN) Compared to Fountain Codes and BATched Sparse (BATS)

The inventors have recognized and appreciated that JEN and fountain codes have notable differences. First, for a fountain code, only the source node may participate in encoding; relay nodes may not participate in re-coding, which may be different from JEN. Hence, a fountain code may not achieve throughput at the full network capacity when there is packet loss. In contrast, JEN can achieve network capacity for lossy networks [13, 23]. Second, fountain codes are sparse codes and have linear encoding/decoding complexity. In contrast, the RLEC and RLNC are dense codes; hence they may not be encoded and decoded as efficiently as fountain codes.

The inventors have recognized and appreciated that JEN and BATS codes also have notable differences. Different from JEN, BATS codes may preserve desirable properties of fountain codes such as low encoding/decoding complexity; furthermore, the computational complexity and buffer requirement for a BATS code at a relay node may be independent of the total number of native packets to be transmitted by the source. It may be theoretically verified for certain cases and numerically demonstrated for some general cases that BATS codes asymptotically achieve rates very close to the network capacity. Compared to the segment-based JEN [4, 14, 21], BATS codes may achieve higher rates for the following reason: under a BATS code, a source node may apply a fountain code to all the native packets, while under segment-based JEN, a source node may apply RLEC only to a segment.

FUN Compared to Erasure Codes

The inventors have recognized and appreciated that, compared to erasure codes (including fountain codes), the FUN approach can achieve much higher throughput for communication over multihop wireless networks. The lower bound on the end-to-end packet loss rate under FUN may be $\max_{i \in \{1, 2, \ldots, N_h\}} p_i$ (where $p_i$ may be the packet loss rate of Link i and $N_h$ may be the number of hops from the source to the destination) while the end-to-end packet loss rate under an erasure code is $1 - \Pi_{i=1}^{N_h}(1-p_i)$ [25], which may be much larger than $\max_{i \in \{1, 2, \ldots, N_h\}} p_i$ for large $N_h$. For example, for $N_h=2$ and $p_i=0.1$ (i=1,2), the end-to-end packet loss rate under FUN may be 0.1 while the end-to-end packet loss rate under an erasure code is 0.19; for $N_h=10$ and $p_i=0.1$ ($\forall i$), the end-to-end packet loss rate under FUN may still be 0.1 while the end-to-end packet loss rate under an erasure code is 0.65, which is 6.5 times higher than 0.1. The much lower end-to-end packet loss rate achieved by FUN may translate to much higher throughput (data rate) compared to erasure codes. In simulations conducted by the inventors, it was observed that the throughput under FUN may be 35 times as large as that under a fountain code (RQ code) where $N_h=10$ and $p_i=0.1$ ($\forall i$).

While not being bound by any particular theory of operation, the inventors theorize that FUN may achieve higher throughput over multihop lossy networks than erasure codes is that under FUN, each relay node may perform network coding, and so coded packets that are lost at each hop may be regenerated/re-coded for the next hop. A useful analogy may be as follows: a person carries a leaky tank of water from the source node to the destination; in each hop, the tank leaks p percent of water; at each relay node, the tank gets refilled to its full capacity; finally, the tank only lost p percent of water from the source node to the destination since only the lost water in the last hop is not refilled. In contrast, erasure codes (including fountain codes) are analogous to no refilling of the water at any relay node since network coding is not used at any relay node, and so the tank loses $(1-(1-p/100)^{N_h}) \times 100$ percent of water from the source node to the destination. Here, p/100 is the percentage (e.g., p=10 gives p/100=10%).

FUN Compared to Network Coding

The inventors have recognized and appreciated that, different from COPE [9], which does not add redundancy to the coded packets, the FUN approach may add redundancy to the received packets at a relay node. Specifically, under FUN, a relay node may re-code the received packets using random linear coding [25, 26]. Different from CLONE [18], which uses repetition coding, the FUN approach may use random linear coding instead of repetition coding and may thereby gain efficiency. Experimental results show that FUN may achieve much higher throughput over lossy channels compared to COPE.

FUN Compared to Joint Erasure Coding and Intra-Session Network Coding (JEN) The inventors have recognized and appreciated that the FUN approach may have a smaller global encoding vector than the JEN approach. For the JEN approach, the global encoding vector may consist of $(\Sigma_i K_i) \times \log q$ bits, where $K_i$ is the total number of packets to be transmitted for Session/Flow i, and q is the size of the finite field $\mathbb{F}_q$ that coding coefficients belong to. For example, considering 10 flows, for q=256, $K_i$=64,000 packets (i=1, . . . , 10), the global encoding vector may consist of 640,000 bytes. It may be impossible to add such a large global encoding vector to a packet header. Therefore, a joint erasure coding and inter-session network coding approach may not be practicable for the JEN approach.

Implementation of the System

FIG. 1 is a diagram illustrating a system 100 that may employ techniques for increasing data throughput and decreasing transmission delay from a source node to a sink node via a relay node as described herein. In the example of FIG. 1, a source node 110 may encode data packets for transmission. According to some embodiments, the source node 110 may encode the data packets using fountain coding (as illustrated at stage 510 of FIG. 5A). However, any suitable coding, including rateless coding, may be used to encode the data packets. The source node 110 may also transmit the data packets to a first relay node 130 via connection 120 (as illustrated at stage 520 of FIG. 5A), which may be a wireless connection. However, any suitable connection or communication technology may be used to communicate among the nodes.

Figure 5A:
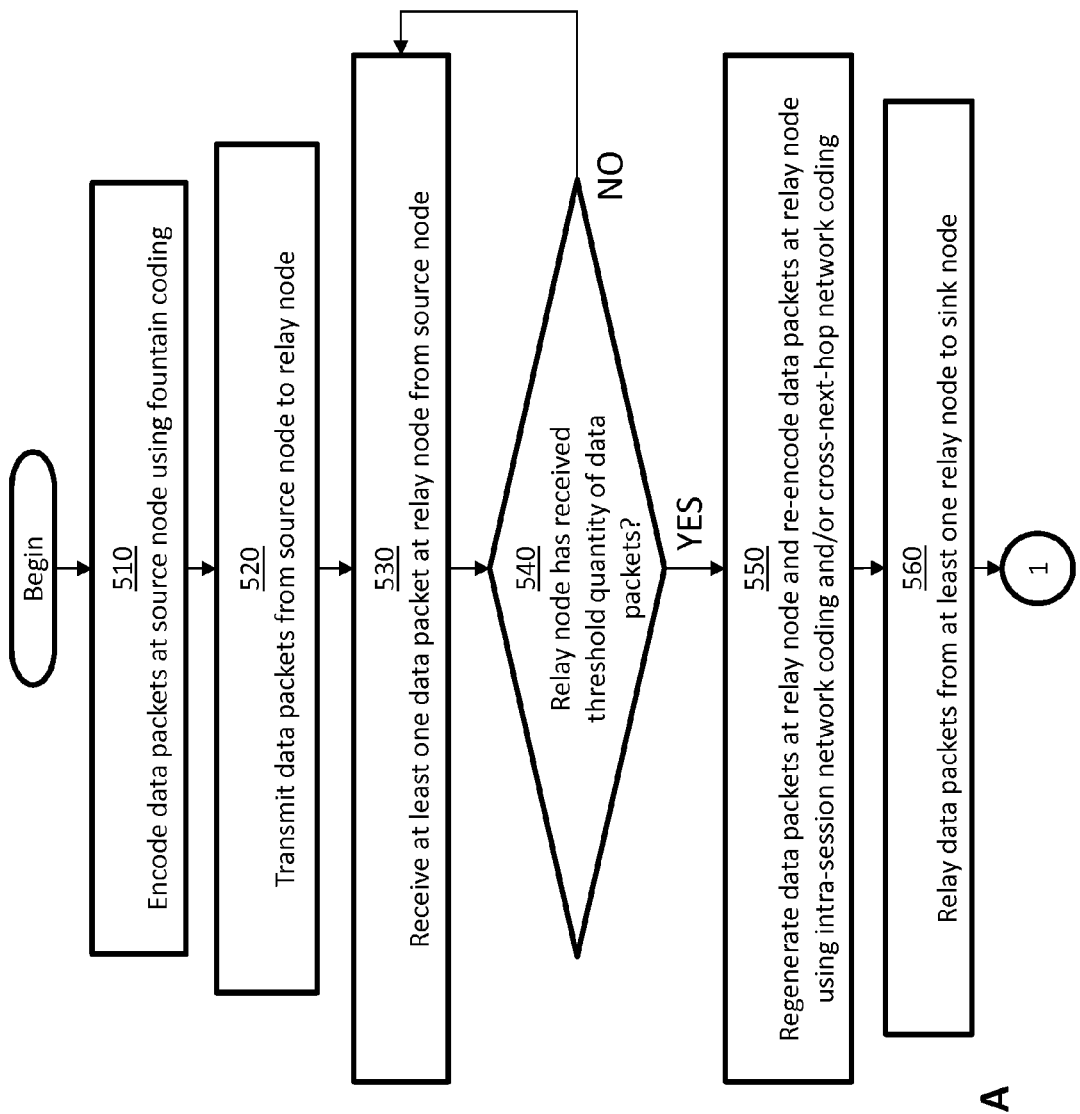
FIGS. 5A and 5B are a flowchart of an exemplary method of increasing data throughput and decreasing transmission delay from a source node to a sink node via a relay node according to some embodiments.
Figure 6:
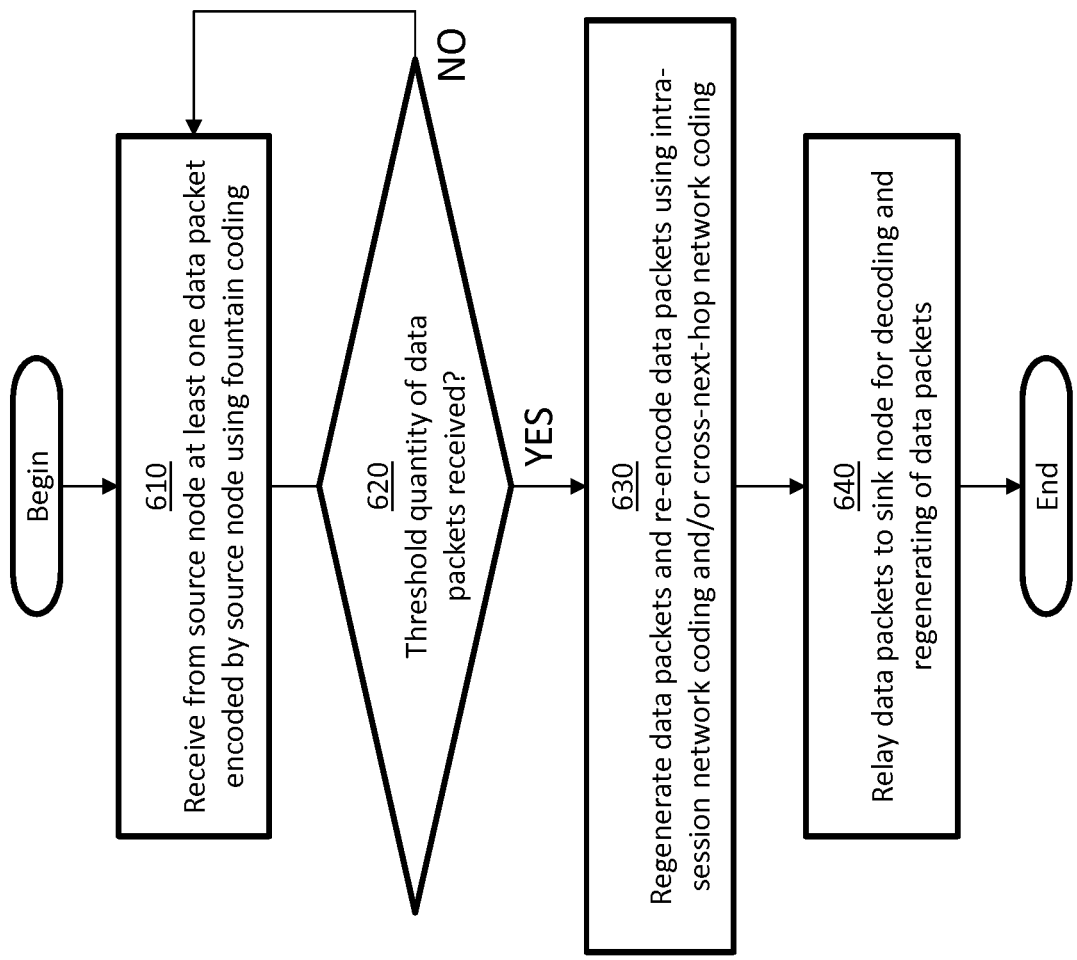
FIG. 6 is a flowchart of an exemplary method of increasing data throughput and decreasing transmission delay from a source node to a sink node via a relay node according to some embodiments.

The first relay node 130 may receive at least one of the data packets from the source node 110 (as illustrated at stage 530 of FIG. 5A and stage 610 of FIG. 6). If the first relay node 130 has received a sufficient quantity of the data packets needed to perform regeneration of the data packets (as illustrated at stage 540 of FIG. 5A and stage 620 of FIG. 6), the first relay node 130 may regenerate and re-encode the data packets (as illustrated at stage 550 of FIG. 5A and stage 630 of FIG. 6). As discussed above, a "sufficient" number of data packets may be assessed based on a fixed threshold and/or a dynamic threshold. According to some embodiments, the first relay node 130 may combine multiple of the plurality of packets for retransmission; alternatively or additionally, the first relay node 130 may re-encode the data packets using intra-session network coding and/or crossnext-hop network coding (as illustrated at stage 550 of FIG. 5A and stage 630 of FIG. 6). However, any suitable coding may be used to re-encode the data packets. In addition, the first relay node 130 may relay or transmit the data packets to a second relay node 150 via connection 140 (as illustrated at stage 560 of FIG. 5A and stage 640 of FIG. 6), which may be a wireless connection.

The second relay node 150 may receive at least one of the data packets from the first relay node 130. If the second relay node 150 has received a sufficient quantity of the data packets, the second relay node 150 may regenerate and re-encode the data packets. According to some embodiments, the second relay node 150 may combine multiple of the plurality of packets for retransmission; alternatively or additionally, the second relay node 150 may re-encode the data packets using intra-session network coding and/or cross-next-hop network coding. In addition, the second relay node 150 may relay or transmit the data packets to a sink node 170 via connection 160, which may be a wireless connection.

In some embodiments, the first relay node 130 and/or the second relay node 150 may regenerate, re-encode, and relay the data packets conditionally, based on the quantity of the data packets received at the given relay node. For example, the first relay node 130 and/or the second relay node 150 may receive a subset of the data packets, and based on the subset of the data packets, the first relay node 130 and/or the second relay node 150 may regenerate the data packets, re-encode the regenerated data packets, and transmit the regenerated, re-encoded data packets.

Figure 2:
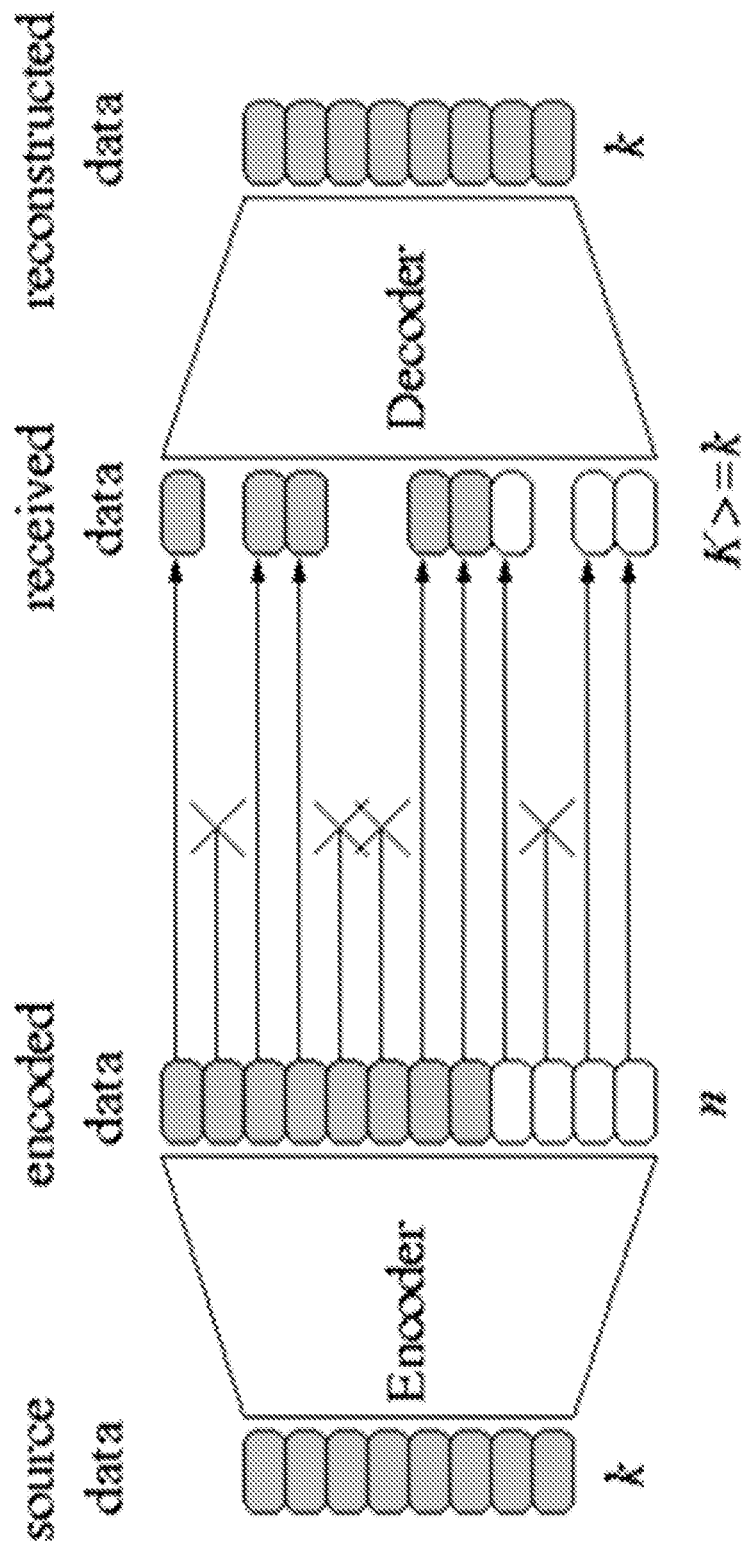
FIG. 2 is a diagram illustrating an exemplary erasure channel and erase channel coding according to some embodiments of the application.
Figure 5B:
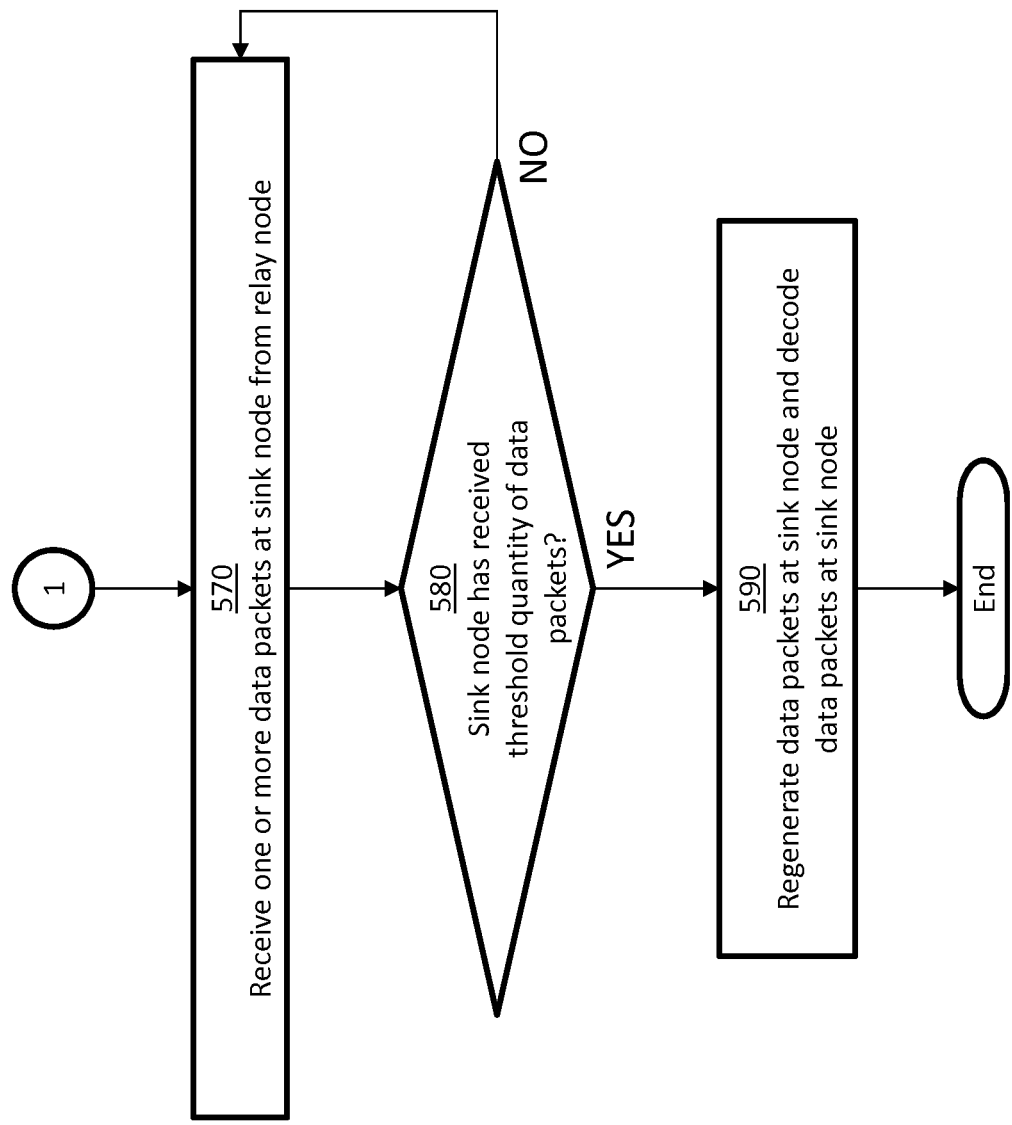

The sink node 170 may receive one or more data packets from the second relay node 150 (as illustrated at stage 570 of FIG. 5B). If the sink node 170 has received a sufficient quantity of the data packets (as illustrated at stage 580 of FIG. 5B), the sink node 170 may regenerate and decode the data packets as shown in FIG. 2 (as illustrated at stage 590 of FIG. 5B).

FIG. 1 shows only two relay nodes, the first relay node 130 and the second relay node 150. This number of relay nodes is shown for simplicity of illustration. It should be appreciated that a network system may have many more nodes and relay nodes.

Since a wireless channel is a shared medium, it can be regarded as a broadcast channel—i.e., a transmitted packet can be overheard by all the nodes within the transmission range of the sender of the packet. Given a pair of nodes Node A and Node B, assume that there are two unicast flows between the two nodes—i.e., a forward flow from Node A to Node B and a backward flow from Node B to Node A. Two coding schemes may be possible, herein referred to as FUN-1 and FUN-2:

According to some embodiments, a FUN-1 relay node may need to recover BATS-coded packets of the forward flow before recovering packets of the backward flow.

According to further embodiments, each FUN-2 relay node may need to add a new encoding vector to the header of a re-coded packet, and only the destination node may perform decoding.

Figure 3A:
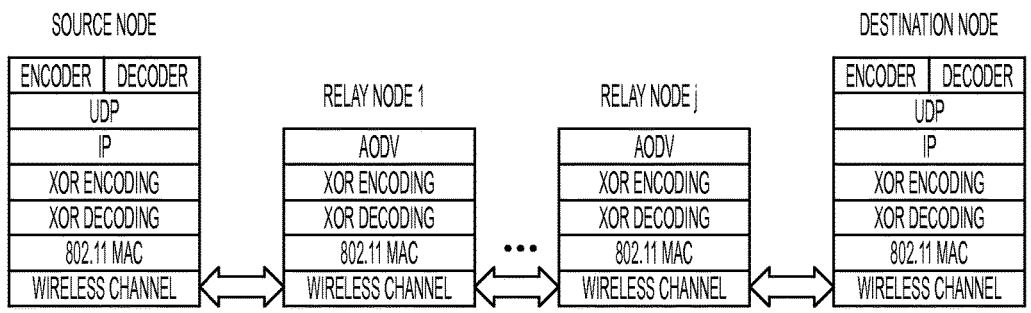
FIGS. 3A and 3B are diagrams illustrating an exemplary source node, relay nodes, and a destination node of a network according to some embodiments of the application.

Under some embodiments according to FUN-1, two sub-layers, i.e., Layer 2.1 and Layer 2.2, may be inserted between Layer 2 (MAC) and Layer 3 (IP). Layer 2.1 may be for cross-next-hop network coding. Layer 2.2 may be for BATS coding [25]. At a source node, Layer 2.2 may use a fountain code to encode all native packets from upper layers; there may be no Layer 2.1 at a source node. At a relay node, Layer 2.1 may be used for cross-next-hop network coding and Layer 2.2 may be used for intra-session network coding; for Layer 2.2, the relay node may run a procedure called FUN-1-2.2-Proc, which may perform RLNC within the same batch. At a destination node, Layer 2.2 may decode the coded packets received; there may be no Layer 2.1 at a destination node. FIG. 3A illustrates these layers for each node for some embodiments according to FUN-1.

Figure 3B:
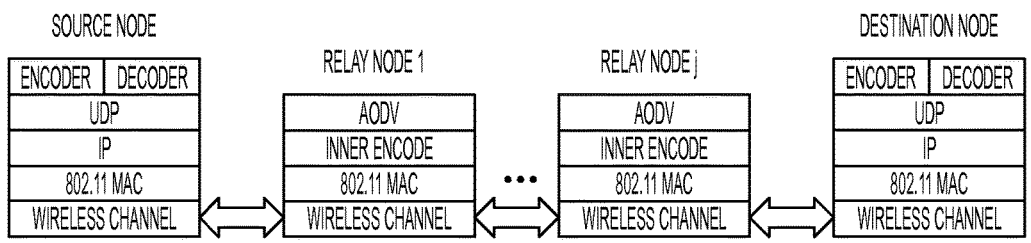

Under some embodiments according to FUN-2, only one sub-layer—i.e., Layer 2.2—may be inserted between Layer 2 (MAC) and Layer 3 (IP). At a source node, Layer 2.2 may use a fountain code to encode all native packets from upper layers. At a relay node, if Layer 2.2 receives a packet with FUN-2 switch enabled, it may run a procedure called FUN-2-2.2-Proc for mixing packets from two flows; otherwise, it may run the procedure FUN-1-2.2-Proc, which may not mix packets from two different flows. Unlike a BATS code, FUN-2-2.2-Proc may perform re-coding of batches from two different flows. At a destination node, Layer 2.2 may decode the coded packets received. FIG. 3B illustrates these layers for each node for some embodiments according to FUN-2.

Different from COPE, FUN-2 may, according to some embodiments, provide an end-to-end solution—i.e., a re-coded packet may never be decoded at a relay node. In contrast, under COPE, a next-hop node such as Node A may need to recover the native packet, whose next-hop node is Node A; the recovery process is like decoding; and the relay node may not recover the native packet if the relay node does not have enough known packets that are mixed in the XOR-ed packet.

According to some embodiments, both FUN-1 and FUN-2 may be restricted to two flows—i.e., forward flow and backward flow between two nodes. An advantage of this is that there may be no need for coordination while a higher coding gain can be achieved. A limitation is that it may restrict its use to two flows between two nodes.

Figure 4A:
FIGS. 4A, 4B, and 4C are diagrams illustrating an exemplary structure and header structures of data packets according to some embodiments of the application.

FIG. 4A illustrates the structure of a FUN-1 or FUN-2 packet according to some embodiments. Both FUN-1 packets and FUN-2 packets may have two headers as shown in FIG. 4A. If a re-coded packet is mixed from two flows (i.e., forward and backward flows), it may have a non-empty Header 2; otherwise, there may be no Header 2.

Figure 4B:
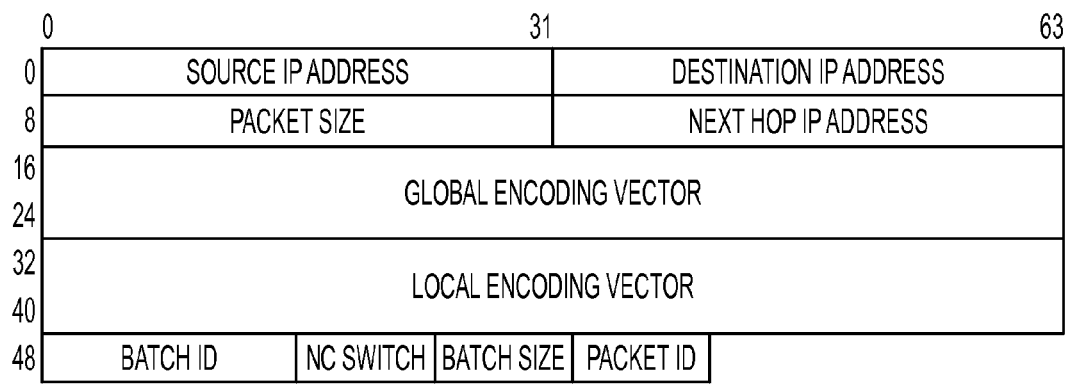
Figure 4C:
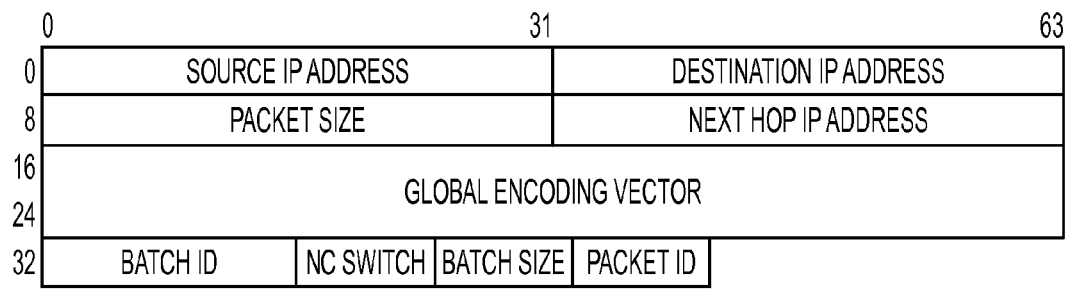

According to some embodiments, Header 1 and Header 2 may have the same structure for FUN-1 and FUN-2. FIG. 4B illustrates the header structure of a FUN-1 packet according to some embodiments. FIG. 4C illustrates the header structure of a FUN-2 packet according to some embodiments. In FIGS. 4B and 4C, the NC switch may include two bits and indicate one of the following four schemes is used: 1) FUN-1, 2) FUN-2, 3) RLNC, 4) no network coding. COPE may relate to a special case of FUN-1, where there may be no encoding vector in FUN Headers; in other words, if the NC switch equals 00 (in binary format) and there is no encoding vector in FUN Headers, then the packet may be a COPE packet. BATS may relate to a special case of FUN-2, where there may be no FUN Header 2. The fountain code corresponds to the no-network-coding case with the NC switch equal to 11 (in binary format) and no encoding vectors in FUN header and no Header 2. The FUN architecture may be extensible to accommodate more than two flows and more than two FUN headers.

Description of FUN-1 Coding

According to some embodiments of FUN-1, at a source node, Layer 2.2 may use a RaptorQ (RQ) code [19] to encode all native packets from Layer 3. The RQ code may be the most advanced fountain code that is available commercially.

Assume Node A will transmit K native packets to Node B and that Node B will transmit K native packets to Node A (although using the same number K of packets is used for both flows here to simplify notation, FUN may use different numbers of packets for the two flows). Each packet may have T symbols in a finite field $\mathbb{F}_q$, where q may be the size of the field. A packet may be denoted by a column vector in $\mathbb{F}_q^T$. The set of K native packets may be denoted by the following matrix herein $$B = [b_1, b_2, \ldots b_K], \quad (1)$$

where $b_i$ may be the i-th native packet. Packets as elements of a set may be written $b_i \in B$, $B' \in B$, etc.

Outer Code of FUN-1

According to some embodiments, the outer code of FUN-1 may be the same as the outer code of a BATS code. The outer coding of FUN-1 may be performed at a source node at Layer 2.2.

At a source node, each coded batch may have M coded packets. The i-th batch $X_i$ may be generated from a subset $B_i \subset B$ ($B \in \mathbb{F}_q^{T \times K}$) by the following operation $$X_i = B_i G_i \quad (2)$$

where $G_i \in \mathbb{F}_q^{d_i \times M}$ may be called the generator matrix of the i-th batch; $B_i \in \mathbb{F}_q^{T \times d_i}$; $X_i \in \mathbb{F}_q^{T \times M}$. Matrix $B_i$ may be randomly formed by two steps: 1) sampling a given degree distribution $\Psi = (\Psi_0, \Psi_1, \ldots, \Psi_K)$ and obtaining a degree $d_i$ with probability $\Psi_{d_i}$; 2) uniformly randomly choosing $d_i$ packets from B to form $B_i$. Matrix $G_i$ may be randomly generated; specifically, all the entries in $G_i$ may be independent and identically distributed with a uniform distribution in $\mathbb{F}_q$. According to some embodiments, $G_i$ may be generated by a pseudorandom number generator and can be recovered at the destinations using the same pseudorandom number generator with the same seed.

Inner Code of FUN-1

According to some embodiments of FUN-1, at a relay node, Layer 2.2 may perform inner coding of FUN-1, which may be the same as that for a BATS code. Assume that $X'_{i,1}$ are the set of packets of the i-th batch correctly received by Node $R_1$ and transmitted by the source, where Node $R_1$ may be the first down-stream relay node. Since there may be lost packets from the source to Node $R_1$, it can be written that $X'_{i,1} \subseteq X_i$. It can also be written that $$X'_{i,1} = X_i E_{i,1} \quad (3)$$

where $E_{i,1}$ may be an erasure matrix representing the erasure channel between the source and Node $R_1$. $E_{i,1}$ may be an M×M diagonal matrix whose entry may be one if the corresponding packet in $X_i$ is correctly received by Node $R_1$, and whose entry may be zero otherwise. Hence, matrix $X'_{i,1} \in \mathbb{F}_q^{T \times M}$ may have the same dimensions as $X_i$. Here, each lost packet in $X_i$ may be replaced by a column vector whose entries are all zero, which may result in matrix $X'_{i,1}$.

At Node $R_1$, the inner coding of FUN-1 may be performed by $$Y_{i,1} = X'_{i,1} H_{i,1} = X_i E_{i,1} H_{i,1} = B_i G_i E_{i,1} H_{i,1}, \quad (4)$$

where $H_{i,1} \in \mathbb{F}_q^{M \times M}$ may be the transfer matrix of an RLNC for the i-th batch at Node $R_1$. After inner-coding, each column of the product matrix $E_{i,1} H_{i,1}$ may be added to the header of the corresponding coded packet as a global encoding vector, which may be needed by the destination node for decoding.

At the relay node of the j-th hop, which may be denoted as Node $R_j$, the following re-coding may be performed $$Y_{i,j} = X'_{i,j} H_{i,j} = Y_{i,j-1} E_{i,j} H_{i,j} \quad (5)$$
$$= B_i G_i E_{i,1} H_{i,1} \cdots E_{i,j} H_{i,j},$$

where $E_{i,j}$ may be an erasure matrix of the i-th batch for the erasure channel from Node $R_{j-1}$ to Node $R_j$; $H_{i,j} \in \mathbb{F}_q^{M \times M}$ may be the transfer matrix of an RLNC for the i-th batch at Node $R_j$. After inner-coding, each column of the product matrix $E_{i,1} H_{i,1} \cdots E_{i,j} H_{i,j}$ may be used to update the global encoding vector of the corresponding coded packet.

The above inner-coding procedure may be implemented in software module FUN-1-2.2-Proc.

XOR Coding of FUN-1

At Node $R_i$ with respect to the forward flow from Node A to Node B, the XOR encoding procedure is shown in Algorithm 1 (FIG. 8). The XOR decoding procedure is shown in Algorithm 2 (FIG. 9).

Precoding of FUN-1

According to some embodiments of FUN-1, at a source node, precoding may be performed. The precoding can be achieved by a traditional erasure code such as LDPC and Reed-Solomon code. The precoding of FUN-1 may be performed at a source node at Layer 2.2. After precoding, the resulting packets may be further encoded by the outer encoder.

Computational Complexity and Delay Induced by FUN-1

According to some embodiments, FUN-1 may incur extra computation overhead compared to TCP for encoding and decoding, and hence extra delay. For the outer code of FUN-1, since a batch mode may be used, the encoding complexity (in terms of number of additions and multiplications per coded packet) may be linear with respect to the batch size M. Since M may usually be small, the delay incurred by the outer code of FUN-1 may be small. For the inner code of FUN-1, again, since a batch mode may be used, the encoding complexity (in terms of number of additions and multiplications per coded packet) may be linear with respect to the batch size M. Since M may usually be small, the delay incurred by the inner code of FUN-1 may be small. Similarly, the XOR encoding complexity and the XOR decoding complexity of FUN-1 (in terms of number of additions and multiplications per coded packet) may be linear with respect to the batch size M. The complexity of precoding of FUN-1 (in terms of number of additions and multiplications per coded packet) may be O(1) since the precoding may be applied to all the native packets K rather than running in a batch mode (for a batch mode, each coded packet may need a batch of packets to participate in coding or decoding). Overall, the computational complexity and delay incurred by FUN-1 may be small.

Description of FUN-2 Coding

FUN-2 may include outer code, inner code, and precoding.

Outer Code of FUN-2

According to some embodiments of FUN-2, the outer code of FUN-2 may be the same as the outer code of FUN-1, except for the decoding process. In the decoding process, the destination node of the forward flow may also be a source node of the backward flow. This destination node can use its known packets of the backward flow to decode the coded packets of the forward flow. To limit the size of the encoding vector in the packet header, at a relay node, FUN-2 may only allow the mixing of two batches from two flows once—i.e., if a packet is already a mixture of two packets from two flows, it may not be re-coded again at a relay node. The FUN-2 outer decoding procedure is shown in Algorithm 3 (FIG. 10). For simplicity, the two nodes may be denoted as Node 0 and 1. The equation in Step 17 can be proved as follows. Since the inner coding may be a mixture of two flows according to Eq. (8), it may be written that $$Y_{i,j} = [B_{i,j}, B_{k,1-j}][H_{i,j}, H_{k,1-j}]^T \qquad (6)$$

$$= B_{i,j}H_{i,j} + B_{k,1-j}H_{k,1-j} \qquad (7)$$

Hence, $B_{i,j}H_{i,j}=Y_{i,j}-B_{k,1-j}H_{k,1-j}$. Since $B_{i,j}H_{i,j}$ may be the coded packets of the i-th batch and Destination j, $B_{i,j}H_{i,j}$ may be assigned to $Y_{i,j}$. This may prove the equation in Step 17.

Inner Code of FUN-2

According to some embodiments of FUN-2, the inner code of FUN-2 may be similar to the inner code of FUN-1 in the sense that both of them may use RLNC. The difference may be that FUN-2 may mix the packets of two flows while FUN-1 may not do so. Specifically, under FUN-2, at the relay node of the j-th hop, which may be denoted as Node $R_j$, the following re-coding may be applied to two juxtaposed matrices of received packets:

$$Z_{i,j}=[Z_{i,j-1}\overline{E}_{i,j}, Z_{k,j+1}\overline{E}_{k,j}]H_{i,j}, \qquad (8)$$

where $Z_{i,j} \in \mathbb{F}_q^{T \times M}$ may contain M re-coded packets of the i-th batch, generated by Node $R_j$; $\overline{E}_{k,j} \in \mathbb{F}_2^{M \times M}$ may be an erasure matrix of the k-th batch for the erasure channel from Node $R_{j+1}$ to Node $R_j$; and $H_{i,j} \in \mathbb{F}_q^{2M \times M}$ may be the transfer matrix of an RLNC for the i-th batch of the forward flow and the k-th batch of the backward flow at Node $R_j$. The FUN-2 inner-coding procedure is shown in Algorithm 4 (FIG. 11), where Destination 0 and 1 may denote the destination of the forward and backward flow, respectively; Packet $y_{i,m}$ may have batch ID i and its position in the batch may be m; a buffer being complete means that a buffer may be full with M packets OR a newly arriving packet may have a batch ID, which may be larger than that of the packets in the buffer. After inner-coding, each column of the matrix $H_{i,j}$ may be added to the global encoding vector of the corresponding coded packet. The inner-coding procedure may be implemented in software module FUN-2-2.2-Proc.

Precoding of FUN-2

The precoding of FUN-2 is the same as the precoding of FUN-1.

Computational Complexity and Delay Induced by FUN-2

According to some embodiments, FUN-2 may incur extra computation overhead compared to TCP for encoding and decoding, and hence extra delay. For the outer code of FUN-2, since a batch mode may be used, the encoding complexity (in terms of number of additions and multiplications per coded packet) may be linear with respect to the batch size M. Since M may usually be small, the delay incurred by the outer code of FUN-2 may be small. For the inner code of FUN-2, again, since a batch mode may be used, the encoding complexity (in terms of number of additions and multiplications per coded packet) may be linear with respect to the batch size M. Since M may usually be small, the delay incurred by the inner code of FUN-2 may be small. The complexity of precoding of FUN-2 (in terms of number of additions and multiplications per coded packet) may be O(1) since the precoding may be applied to all the native packets K rather than running in a batch mode. Overall, the computational complexity and delay incurred by FUN-2 may be small.

Examples Based on Simulation

Simulator

QualNet was used in these examples to implement FUN coding according to some embodiments [27]. For comparison, QualNet was also used to implement a BATS code [25], a fountain code (specifically, the RQ code [19]), RLNC [21], and COPE [9]. For COPE, only the XOR operation for mixing two flows was implemented, with Layer 4 in the COPE scheme being TCP. The reason for using TCP for COPE is that each scheme may need to achieve perfect recovery of lost packets to make a fair comparison.

For RLNC, a file may be segmented into batches, each of which may consist of M native packets. Each batch may be transmitted independently as if it is a single file; there may be no coding across two batches. A source node may keep transmitting coded packets of a batch until the source node receives an ACK message from the destination node. A relay node may have a buffer of M packets; when a relay node receives a packet from its upstream node, it may place the packet in the buffer; if the buffer is full, the newly arriving packet may push out the oldest packet; then the relay node may take all the packets in the buffer as input and generate one RLNC-coded packet, which may then be sent out to its downstream node. When a destination node decodes all the native packets in a batch, the destination node may transmit an ACK message toward the source node. Upon receiving the ACK message, the source node may stop transmitting the coded packets of the current batch, and may start to transmit the coded packets of the next batch.

IEEE 802.11b was used for the physical layer and MAC layer of each wireless node, and the Ad hoc On-Demand Distance Vector (AODV) protocol was used for routing. For COPE, TCP was used as the Layer 4 protocol; for FUN-1, FUN-2, BATS, fountain code, and RLNC, UDP was used as the Layer 4 protocol. These examples had the following settings: packet size T=1024 bytes; batch size M=16 packets.

Exemplary Results

The following results indicate the effectiveness of the techniques of FUN coding as described herein.

The inventors conducted experiments for the following four examples: 1) two hops with no node mobility (fixed topology) under various packet loss rate per hop, 2) various number of hops with no node mobility (fixed topology) under fixed packet loss rate per hop, 3) two hops with fixed source/destination nodes and a moving relay node (dynamic topology), 4) a large number of nodes with node mobility (dynamic topology). There are two flows (forward and backward flows) between each source/destination pair. For each example, the inventors compared the performance of seven schemes: FUN-1, FUN-2, a BATS code, a fountain code, RLNC, COPE, and TCP.

The lower the packet sending rate of UDP, the lower the throughput. Too high of a packet sending rate of UDP, however, may incur congestion and packet loss. Hence, in the experiments of FUN-1, FUN-2, BATS, fountain code, and RLNC, which use UDP as their Layer 4 protocol, the inventors tuned the packet sending rate of UDP to find the maximum throughput for each of these five schemes. At the optimal packet sending rate of UDP, the inventors conducted ten experiments for each of these five schemes and took the average throughput of the ten experiments as the performance measure of each scheme.

For COPE and TCP, the inventors conducted ten experiments for each of these two schemes and took the average throughput of the ten experiments as the performance measure of COPE and TCP.

EXAMPLE 1

Two Hops with No Node Mobility

The inventors arranged this set of experiments as follows. There are three nodes in the network: a source node, a destination node, and one relay node. The communication path from the source node to the destination node has two hops. All three nodes are immobile, and so the network topology is fixed.

The number of native packets to be transmitted by the source is denoted K. In the experiments, the inventors measured the throughput in Mbits/s under different values of K and different packet loss rate (PLR). The PLR may be the same for all the links/hops in the network. Here, the PLR may not include packet loss due to the thermal noise in the physical layer and packet collision, which may not be directly controllable; here the PLR may be achieved by randomly dropping a correctly received packet at Layer 2 with a probability equal to the given PLR.

Table I shows the total throughput of the two flows (i.e., forward/backward flows) of the seven schemes under Example 1. The inventors made the following observations:
- For both the lossless and lossy situations, FUN-1 and FUN-2 may achieve the highest throughput.
- The throughput of FUN-2 may be higher than or equal to that of FUN-1. This may be because FUN-2 may use RLNC at a relay node and RLNC has a higher coding gain than the XOR operation used in FUN-1.
- For both the lossless and lossy situations, the fountain code may achieve a higher throughput than the BATS code. This is because a BATS code may only achieve higher throughput than a fountain code when there are more than two hops or the PLR is high (e.g., 20%).
- For the lossless situation, COPE may achieve a higher throughput than the BATS and the fountain code for K=1600 but may achieve a lower throughput than the BATS and the fountain code for K=6400 and 16000. This may be due to the fact that BATS codes and fountain codes are erasure channel coding (while COPE is not) and hence, the more the native packets to transmit, the higher the coding gain is.
- For both the lossless and lossy situations, RLNC may achieve a lower throughput than the fountain code and the BATS code. This may be because a coded packet in RLNC may be restricted to one batch of M native packets while a coded packet in the BATS code and the fountain code may be a random mixture of all the K native packets; hence each native packet may have less chance of being recovered in RLNC for the same number of coded packets compared to the BATS code and the fountain code.
- RLNC may achieve a lower throughput than COPE in the lossless situation, but may achieve a higher throughput than COPE in the lossy situation. This may be because RLNC is erasure channel coding: when there is no packet loss, the redundancy induced by RLNC may reduce the throughput; when there is packet loss, the reliability induced by RLNC may make it achieve a higher throughput.
- TCP may achieve the least throughput for the lossless situation. This is because TCP may have a slow start and a congestion avoidance phase, which may reduce throughput. In contrast, COPE may have network coding gain and FUN-1, FUN-2, the BATS code, the fountain code, and RLNC may use UDP with an optimal packet sending rate.

For PLR=10%, COPE and TCP may time out and not receive all K number of packets due to high packet loss rate. This may be consistent with TCP performing poorly under environments of high packet loss rates [8].

TABLE I

THROUGHPUT UNDER EXAMPLE 1

| K | Scheme | Throughput (Mbits/s) PLR = 0 | PLR = 10% |
|---|---|---|---|
| 1600 | FUN-1 | 0.697 | 0.652 |
| | FUN-2 | 0.697 | 0.668 |
| | BATS | 0.484 | 0.488 |
| | Fountain | 0.498 | 0.508 |
| | RLNC | 0.460 | 0.340 |
| | COPE | 0.520 | N/A |
| | TCP | 0.375 | N/A |
| 6400 | FUN-1 | 0.720 | 0.665 |
| | FUN-2 | 0.727 | 0.669 |
| | BATS | 0.517 | 0.502 |
| | Fountain | 0.533 | 0.513 |
| | RLNC | 0.460 | 0.340 |
| | COPE | 0.500 | N/A |
| | TCP | 0.378 | N/A |
| 16000 | FUN-1 | 0.714 | 0.637 |
| | FUN-2 | 0.714 | 0.655 |
| | BATS | 0.521 | 0.487 |
| | Fountain | 0.533 | 0.493 |
| | RLNC | 0.460 | 0.340 |
| | COPE | 0.504 | N/A |
| | TCP | 0.379 | N/A |

EXAMPLE 2

Various Number of Hops with No Node Mobility

The inventors arranged this set of experiments as follows. The network consists of a source node, a destination node, and 1 or 2 or 4 relay nodes. All the nodes in the network form a chain topology from the source node to the destination node. The communication path from the source node to the destination node has 2 or 3 or 5 hops. All the nodes are immobile, and so the network topology is fixed. For all the experiments in Example 2, the inventors set PLR=10% for each hop/link. Again, the PLR does not include packet loss due to the thermal noise in the physical layer and packet collision.

Table II shows the throughput of seven schemes under Example 2. The inventors made the following observations:
- For both the lossless and lossy situations, FUN-1 and FUN-2 may achieve similar throughput and their throughput may be the highest among the seven schemes.
- When the number of hops is two, the throughput of FUN-2 may not be less than FUN-1. This may be because FUN-2 may use RLNC at a relay node.
- When the number of hops is more than two, FUN-1 may achieve a higher throughput than FUN-2. This may be because FUN-2 may only allow mixing two flows once but FUN-1 may allow mixing two flows an unlimited number of times. Therefore, FUN-1 may potentially have a higher coding gain than FUN-2 due to more coding opportunities. However, this may not always be true. Since FUN-1 may always use broadcast, and FUN-2 may have to use unicast when FUN-2 packet has already been mixed from two flows once, FUN-2 unicast packets may be more reliably received than FUN-1 broadcast packets under 802.11 MAC. In the 802.11 unicast mode, packets may be immediately acknowledged by their intended next-hop nodes; if no ACK message is received, the 802.11 MAC layer may retransmit the packet a number of times (with exponential backoff) until an ACK message is received or a time-out event happens. A broadcast packet may not be acknowledged and retransmitted under 802.11, however.

When the number of hops is two, the fountain code may achieve a higher throughput than the BATS code; and when the number of hops is more than two, the BATS code may achieve a higher throughput than the fountain code.

COPE and TCP may time out and not receive all K number of packets due to high packet loss rate. Thus, COPE and TCP may achieve the least throughput.

For all the situations in Example 2, RLNC achieves a lower throughput than the BATS code. This is because a coded packet in RLNC is restricted to one batch of M native packets while a coded packet in the BATS code is a random mixture of all the K native packets.

When the number of hops is 2 and 3, RLNC achieves a lower throughput than the fountain code. This is because a coded packet in RLNC is restricted to one batch of M native packets while a coded packet in the fountain code is a random mixture of all the K native packets. But when the number of hops is 5, RLNC achieves a higher throughput than the fountain code. This is because the more relay nodes, the more opportunities for network coding in RLNC while the fountain code does not have such a benefit.

For the example of K=6400 and five hops, the fountain code does not receive all the K native packets within 6000 seconds, which we call "timeout". The timeout is because the end-to-end packet loss is too high for five hops.

TABLE II

THROUGHPUT UNDER EXAMPLE 2

| K | Scheme | Throughput (Mbits/s) | | |
|---|---|---|---|---|
| | | 2 hops | 3 hops | 5 hops |
| 1600 | FUN-1 | 0.652 | 0.413 | 0.045 |
| | FUN-2 | 0.652 | 0.364 | 0.042 |
| | BATS | 0.488 | 0.317 | 0.036 |
| | Fountain | 0.508 | 0.271 | 0.005 |
| | RLNC | 0.340 | 0.202 | 0.024 |
| | COPE | N/A | N/A | N/A |
| | TCP | N/A | N/A | N/A |
| 6400 | FUN-1 | 0.665 | 0.376 | 0.026 |
| | FUN-2 | 0.669 | 0.357 | 0.033 |
| | BATS | 0.502 | 0.327 | 0.025 |
| | Fountain | 0.513 | 0.220 | N/A |
| | RLNC | 0.340 | 0.202 | 0.024 |
| | COPE | N/A | N/A | N/A |
| | TCP | N/A | N/A | N/A |

EXAMPLE 3

Two Hops with Fixed Source/Destination Nodes and a Moving Relay Node

The inventors arranged this set of experiments as follows. There are three nodes in the network: a fixed source node, a fixed destination node, and one moving relay node. The distance between the source node and the destination node is 1200 meters; the transmission range of each node is 700 meters. Hence, the source node cannot directly communicate with the destination node; a relay node is needed. The relay node is moving back and forth along the straight line, which is perpendicular to the straight line that links the source node and the destination node; in addition, the relay node has equal distance to the source node and the destination node. When the relay node moves into the transmission range of the source node, it can pick up the packets transmitted by the source node and relay the packets to the destination node. When the relay node moves out of the transmission range of the source node, it cannot receive packets transmitted by the source node although the source node keeps transmitting; in this example, all the packets transmitted by the source node will be lost. The communication path from the source node to the destination node has two hops. Since the relay node moves around, the network topology is dynamic.

In this set of experiments, the number of native packets to be transmitted by the source is 1600 packets—i.e., K=1600. Table III shows the throughput of seven schemes under Example 3. The inventors made the following observations:

FUN-1 and FUN-2 may achieve the highest throughput among the seven schemes.

The fountain code may achieve a slightly higher throughput than the BATS code. This is because when the relay node moves out of the transmission range of the source node, the BATS code may suffer more than the fountain code. This can be illustrated by an example for the BATS code: the relay node may hold M/2 packets of the same batch when it moves out of the transmission range; when the relay node comes back within the transmission range of the source node, the source node may already transmit M/2 packets of another batch (which may be lost due to being out of range) and may transmit the remaining M/2 packets of this batch; in this situation, two batches lost 50% of the packets, resulting in more BATS-coded packets to be transmitted to recover the native packets that correspond to the lost packets, in comparison to the fountain code.

RLNC may achieve a lower throughput than the BATS code. This is because coding in RLNC may be restricted to a batch of M native packets while BATS may not.

COPE may achieve a lower throughput than RLNC. This is because RLNC may use erasure channel coding, which may be more robust against packet loss when the relay node moves out of the transmission range.

TCP may achieve the least throughput. This may be because all other six schemes have coding gain.

TABLE III

THROUGHPUT UNDER EXAMPLE 3

| Scheme | Throughput (Mbits/s) |
|---|---|
| FUN-1 | 0.250 |
| FUN-2 | 0.250 |
| BATS | 0.232 |
| Fountain | 0.237 |
| RLNC | 0.220 |
| COPE | 0.109 |
| TCP | 0.105 |

Example 4

A Large Number of Nodes with Node Mobility

The inventors arranged this set of experiments as follows. There are 400 nodes in the network. All the nodes move under the random waypoint mobility model—i.e., each node selects a random position, moves towards it in a straight line at a constant speed that is randomly selected from a range, and pauses at that destination; and each node repeats this process throughout the experiment. Due to node mobility, the communication routes change over time. Hence, the network topology is dynamic.

In this set of experiments, the range of the nodes' speed is from 5 meters/s to 10 meters/s. All the nodes move in a square area of 3000 meters by 3000 meters. The inventors measured the throughput between a specific pair of source/destination nodes. This pair of source/destination nodes do not move and are not in the transmission range of each other. Hence, they need relay nodes to forward packets to the destination. The relay nodes are moving around. The number of hops between the intended source and the intended destination is varying since the relay nodes are moving around.

To make the experiments more realistic, the inventors also generated some background traffic. The background traffic was generated in the following manner: 100 pairs of nodes were randomly selected out of the 400 nodes; a Constant Bit Rate (CBR) is generated between each pair of nodes. Each CBR flow lasts for 30 seconds with a random start time. Since the data rate needs to be constant for CBR, the source generates a packet every $T_c$ second ($T_c \in (0,1]$); the packet size is 1024 bytes. For example, for $T_c=1$ second, the data rate is 1024 bytes/s. The number of hops from the source node to the destination node is random, depending on the positions of all the nodes. Since all the nodes are mobile, the network topology is dynamic.

In this set of experiments, the number of native packets to be transmitted by the source under study is 1600 packets—i.e., K=1600. Table IV shows the throughput of seven schemes under Example 4. The inventors made the following observations:

- FUN-2 may achieve the highest throughput and FUN-1 may achieve the second highest throughput. This may be because the number of hops in Example 4 may usually be small (mostly two hops) and hence FUN-2 may perform better than FUN-1 as in Example 1.
- COPE may achieve the third highest throughput and TCP may achieve the fourth highest throughput. Their throughput may be higher than the BATS code, the fountain code, and RLNC; this may be because congestion and MAC contention are serious performance-limiting problems in multihop wireless networks and COPE and TCP both may have congestion control to avoid congestion/contention with the background traffic while the BATS code, the fountain code, and RLNC may not.
- The fountain code may achieve a higher throughput than the BATS code. The reason may be the same as in Example 3. The BATS code may be less robust against moving relay nodes compared to the fountain code.
- RLNC may achieve a lower throughput than the BATS code as in Example 3.

TABLE IV

THROUGHPUT UNDER EXAMPLE 4

| Scheme | Throughput (Mbits/s) |
|---|---|
| FUN-1 | 0.669 |
| FUN-2 | 0.691 |
| BATS | 0.330 |
| Fountain | 0.385 |
| RLNC | 0.291 |
| COPE | 0.493 |
| TCP | 0.451 |

In summary, all the experimental results demonstrated that the FUN approach may achieve higher throughput than BATS code, fountain code (RQ code), RLNC, COPE, and TCP for multihop wireless networks.

References

The following references are incorporated herein by reference in their entireties:

[1] Aguayo, Daniel and Bicket, John and Biswas, Sanjit and Judd, Glenn and Morris, Robert. Link-level measurements from an 802.11 b mesh network. ACM SIGCOMM Computer Communication Review, 34(4):121-132, 2004.

[2] Ahlswede, Rudolf and Cai, Ning and Li, S-YR and Yeung, Raymond W. Network information flow. IEEE Transactions on Information Theory, 46(4):1204-1216, 2000.

[3] Chachulski, Szymon and Jennings, Michael and Katti, Sachin and Katabi, Dina. Trading structure for randomness in wireless opportunistic routing. Proceedings of ACM SIGCOMM, 2007.

[4] Chou, Philip A and Wu, Yunnan and Jain, Kamal. Practical network coding. Proceedings of 41st Annual Allerton Conference on Communication, Control, and Computing, 2003.

[5] Haeupler, Bernhard. Analyzing network coding gossip made easy. Proceedings of ACM Symposium on Theory of computing (STOC), pages 293-302, 2011.

[6] Haeupler, Bernhard and Médard, Muriel. One packet suffices-highly efficient packetized network coding with finite memory. Proceedings of IEEE International Symposium on Information Theory (ISIT), pages 1151-1155, 2011.

[7] Ho, Tracey and Koetter, Ralf and Medard, Muriel and Karger, David R and Effros, Michelle. The benefits of coding over routing in a randomized setting. Proceedings of IEEE International Symposium on Information Theory (ISIT), 2003.

[8] Holland, Gavin and Vaidya, Nitin. Analysis of TCP performance over mobile ad hoc networks. Wireless Networks, 8(2/3):275-288, 2002.

[9] Katti, Sachin and Rahul, Hariharan and Hu, Wenjun and Katabi, Dina and Medard, Muriel and Crowcroft, Jon. XORs in the air: practical wireless network coding. ACM SIGCOMM Computer Communication Review, number 4, pages 243-254, 2006.

[10] Kim, MinJi and Cloud, Jason and ParandehGheibi, Ali and Urbina, Leonardo and Fouli, Kerim and Leith, Douglas and Medard, Muriel. Network Coded TCP (CTCP). arXiv preprint arXiv:1212.2291, 2012.

[11] Li, S-YR and Yeung, Raymond W and Cai, Ning. Linear network coding. IEEE Transactions on Information Theory, 49(2):371-381, 2003.

[12] Lin, Shu and Costello, Daniel J. Error control coding. Pearson Prentice-Hall: Upper Saddle River, N.J., 2nd edition, 2004.

[13] Lun, Desmond S and Médard, Muriel and Koetter, Ralf and Effros, Michelle. On coding for reliable communication over packet networks. Physical Communication, 1(1):3-20, 2008.

[14] Park, Joon-Sang and Gerla, Mario and Lun, Desmond S and Yi, Yunjung and Medard, Muriel. Codecast: a network-coding-based ad hoc multicast protocol. IEEE Wireless Communications, 13(5):76-81, 2006.

[15] Qureshi, Jalaluddin and Foh, Chuan Heng and Cai, Jianfei. Optimal solution for the index coding problem using network coding over GF (2). IEEE Communications Society Conference on Sensor, Mesh and Ad Hoc Communications and Networks (SECON), pages 209-217, 2012.

[16] Qureshi, Jalaluddin and Fohy, Chuan Heng and Cai, Jianfei. Primer and Recent Developments on Fountain Codes. arXiv preprint arXiv:1305.0918, 2013.

[17] Rappaport, Theodore S. Wireless communications: principles and practice. Prentice-Hall: Upper Saddle River, N J, 1996.

[18] Rayanchu, Shravan and Sen, Sayandeep and Wu, Jianming and Banerjee, Suman and Sengupta, Sudipta. Loss-aware network coding for unicast wireless sessions: design, implementation, and performance evaluation. ACM SIGMETRICS Performance Evaluation Review, number 1, pages 85-96, 2008.

[19] Amin Shokrollahi and Michael Luby. Raptor Codes. Foundations and Trends in Communications and Information Theory, 6(3-4):213-322, 2011.

[20] Silva, Danilo and Zeng, Weifei and Kschischang, Frank R. Sparse network coding with overlapping classes. Proceedings of IEEE Workshop on Network Coding, Theory, and Applications (NetCod), pages 74-79, 2009.

[21] Wang, Mea and Li, Baochun. Lava: A reality check of network coding in peer-to-peer live streaming. IEEE INFOCOM 2007, pages 1082-1090.

[22] Wu, Dapeng and Hou, Yiwei Thoms and Zhang, Ya-Qin. Transporting real-time video over the Internet: Challenges and approaches. Proceedings of the IEEE, 88(12):1855-1877, 2000.

[23] Wu, Yunnan. A trellis connectivity analysis of random linear network coding with buffering. IEEE International Symposium on Information Theory, pages 768-772, 2006.

[24] Wu, Yunnan and Chou, Philip A and Kung, Sun-Yuan. Information exchange in wireless networks with network coding and physical-layer broadcast. Technical report, Microsoft Corporation, Redmond, Wash., 2004.

[25] Yang, Shenghao and Yeung, Raymond W. Batched Sparse Codes. submitted to IEEE Transactions on Information Theory.

[26] Yang, Shenghao and Yeung, Raymond W. Coding for a network coded fountain. Proceedings of IEEE International Symposium on Information Theory (ISIT), pages 2647-2651, 2011.

[27] QualNet web site. http://web.scalable-networks.com/content/qualnet.

Computing Environment

Techniques for increasing data throughput and decreasing transmission delay from a source node to a sink node via a relay node may be implemented on any suitable hardware, including a programmed computing system. For example, FIG. 1 illustrates a system implemented with multiple computing devices, which may be distributed and/or centralized. Also, FIGS. 5A, 5B, and 6 illustrate algorithms executing on at least one computing device. FIG. 5 illustrates an example of a suitable computing system environment 300 on which embodiments of these algorithms may be implemented. This computing system may be representative of a computing system that implements the described technique of increasing data throughput and decreasing transmission delay from a source node to a sink node via a relay node. However, it should be appreciated that the computing system environment 300 is only one example of a suitable computing environment and is not intended to suggest any limitation as to the scope of use or functionality of the invention. Neither should the computing environment 300 be interpreted as having any dependency or requirement relating to any one or combination of components illustrated in the exemplary operating environment 300.

The invention is operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments or cloud-based computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 5, an exemplary system for implementing the invention includes a general purpose computing device in the form of a computer 310. Though a programmed general purpose computer is illustrated, it should be understood by one of skill in the art that algorithms may be implemented in any suitable computing device. Accordingly, techniques as described herein may be implemented in a system for increasing data throughput and decreasing transmission delay from a source node to a sink node via a relay node. These techniques may be implemented in such network devices as originally manufactured or as a retrofit, such as by changing program memory devices holding programming for such network devices or software download. Thus, some or all of the components illustrated in FIG. 7, though illustrated as part of a general purpose computer, may be regarded as representing portions of a node or other component in a network system.

Components of computer 310 may include, but are not limited to, a processing unit 320, a system memory 330, and a system bus 321 that couples various system components including the system memory 330 to the processing unit 320. The system bus 321 may be any of several types of bus structures including a memory bus or memory controller, a peripheral bus, and a local bus using any of a variety of bus architectures. By way of example and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 310 typically includes a variety of computer readable media. Computer readable media can be any available media that can be accessed by computer 310 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can by accessed by computer 310. Communication media typically embodies computer readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example and not limitation, communication media includes wired media such as a wired network or direct-wired connection, and wireless media such as acoustic, radio frequency (RF), infrared (IR), and other wireless media. Combinations of any of the above should also be included within the scope of computer readable media.

Figure 7:
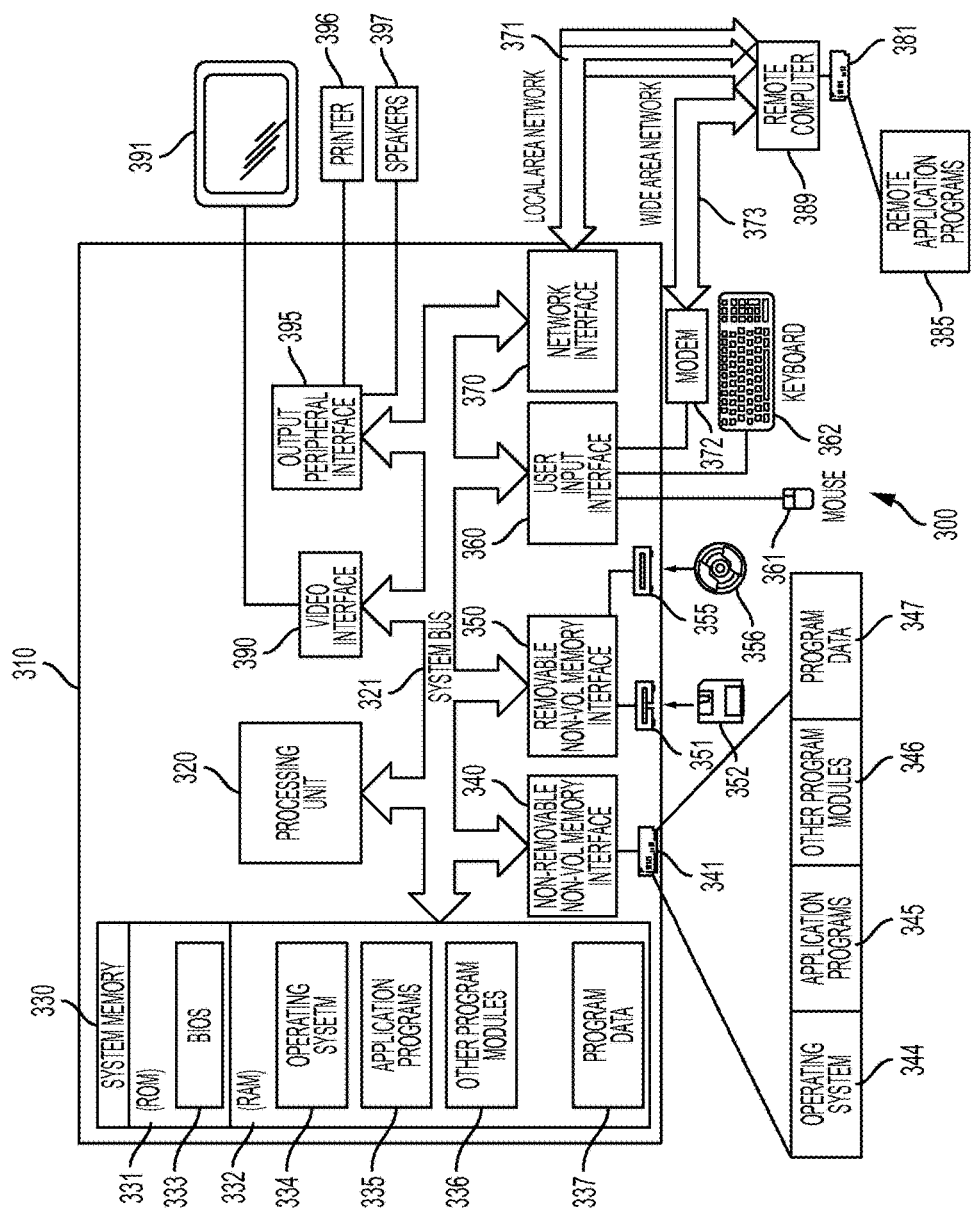
FIG. 7 is a diagram illustrating a computer system on which some embodiments of the invention may be implemented.

The system memory 330 includes computer storage media in the form of volatile and/or nonvolatile memory such as read only memory (ROM) 331 and random access memory (RAM) 332. A basic input/output system 333 (BIOS), containing the basic routines that help to transfer information between elements within computer 310, such as during start-up, is typically stored in ROM 331. RAM 332 typically contains data and/or program modules that are immediately accessible to and/or presently being operated on by processing unit 320. By way of example and not limitation, FIG. 7 illustrates operating system 334, application programs 335, other program modules 336, and program data 337.

The computer 310 may also include other removable/non-removable, volatile/nonvolatile computer storage media. By way of example only, FIG. 7 illustrates a hard disk drive 341 that reads from or writes to non-removable, nonvolatile magnetic media, a magnetic disk drive 351 that reads from or writes to a removable, nonvolatile magnetic disk 352, and an optical disk drive 355 that reads from or writes to a removable, nonvolatile optical disk 356 such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 341 is typically connected to the system bus 321 through an non-removable memory interface such as interface 340, and magnetic disk drive 351 and optical disk drive 355 are typically connected to the system bus 321 by a removable memory interface, such as interface 350.

The drives and their associated computer storage media discussed above and illustrated in FIG. 7, provide storage of computer readable instructions, data structures, program modules, and other data for the computer 310. In FIG. 7, for example, hard disk drive 341 is illustrated as storing operating system 344, application programs 345, other program modules 346, and program data 347. Note that these components can either be the same as or different from operating system 334, application programs 335, other program modules 336, and program data 337. Operating system 344, application programs 345, other program modules 346, and program data 347 are given different numbers here to illustrate that, at a minimum, they are different copies. A user may enter commands and information into the computer 310 through input devices such as a keyboard 362 and pointing device 361, commonly referred to as a mouse, trackball, or touch pad. Other input devices (not shown) may include a microphone, joystick, game pad, satellite dish, scanner, or the like. These and other input devices are often connected to the processing unit 320 through a user input interface 360 that is coupled to the system bus, but may be connected by other interface and bus structures, such as a parallel port, game port, or a universal serial bus (USB). A monitor 391 or other type of display device is also connected to the system bus 321 via an interface, such as a video interface 390. In addition to the monitor, computers may also include other peripheral output devices such as speakers 397 and printer 396, which may be connected through an output peripheral interface 395.

The computer 310 may operate in a networked environment using logical connections to one or more remote computers, such as a remote computer 380. The remote computer 380 may be a personal computer, a server, a router, a network PC, a peer device, or some other common network node, and typically includes many or all of the elements described above relative to the computer 310, although only a memory storage device 381 has been illustrated in FIG. 7. The logical connections depicted in FIG. 7 include a local area network (LAN) 371 and a wide area network (WAN) 373, but may also include other networks. Such networking environments are commonplace in offices, enterprise-wide computer networks, intranets, and the Internet.

When used in a LAN networking environment, the computer 310 is connected to the LAN 371 through a network interface or adapter 370. When used in a WAN networking environment, the computer 310 typically includes a modem 372 or other means for establishing communications over the WAN 373, such as the Internet. The modem 372, which may be internal or external, may be connected to the system bus 321 via the user input interface 360, or other appropriate mechanism. In a networked environment, program modules depicted relative to the computer 310, or portions thereof, may be stored in the remote memory storage device. By way of example and not limitation, FIG. 7 illustrates remote application programs 385 as residing on memory device 381. It will be appreciated that the network connections shown are exemplary and other means of establishing a communications link between the computers may be used.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the attached claims, various elements are recited in different claims. However, the claimed elements, even if recited in separate claims, may be used together in any suitable combination.

What is claimed is:

1. A network system for increasing data throughput and decreasing transmission delay from a source node to a sink node via a relay node, the network system comprising:
    a source node configured to encode a plurality of data packets using rateless coding and transmit the plurality of data packets;
    a relay node configured to:
        receive at least one of the plurality of data packets from the source node, and
        responsive to receiving a sufficient quantity of the plurality of data packets, regenerate, re-encode, and relay the plurality of data packets, wherein the relay node (1) uses intra-session network coding to re-encode a first set of data packets from the sufficient quantity of the plurality of data packets in the same batch of the same session, and (2) uses inter-session network coding to re-encode a second set of data packets from the sufficient quantity of the plurality of data packets destined to different next-hop nodes; and
    a sink node configured to:
        receive one or more of the plurality of data packets from the relay node, and
        responsive to receiving the sufficient quantity of the plurality of data packets, regenerate and decode the plurality of data packets, wherein the sufficient quantity of the plurality of data packets comprises mixed data packets from at least two different flows.

2. The network system of claim 1, wherein the source node is further configured to encode the plurality of data packets using fountain coding.

3. The network system of claim 2, wherein the relay node is further configured to, if the relay node has received the sufficient quantity of the plurality of data packets, combine multiple of the plurality of packets for retransmission.

4. The network system of claim 2, wherein the inter-session network coding comprises cross-next-hop network coding.

5. The network system of claim 2, wherein the relay node is further configured to, if the relay node has received the sufficient quantity of the plurality of data packets, regenerate the plurality of data packets using local encoding vectors.

6. The network system of claim 5, wherein the relay node is further configured to, if the relay node has received the sufficient quantity of the plurality of data packets, regenerate a plurality of data packets of a forward flow and subsequently regenerate a plurality of data packets of a backward flow.

7. The network system of claim 2, wherein the relay node is further configured to, if the relay node has received the sufficient quantity of the plurality of data packets, add a new encoding vector to a header of each of the at least one of the plurality of data packets regenerated.

8. A method for increasing data throughput and decreasing transmission delay from a source node to a sink node via a relay node, the method comprising:
    receiving, from the source node, at least one of a plurality of data packets encoded by the source node using fountain coding;
    responsive to receiving a sufficient quantity of the plurality of data packets, regenerating, re-encoding, and relaying the plurality of data packets by the relay node, wherein the relay node (1) uses intra-session network coding to re-encode a first set of data packets from the sufficient quantity of the plurality of data packets in the same batch of the same session, and (2) uses inter-session network coding to re-encode a second set of data packets from the sufficient quantity of the plurality of data packets destined to different next-hop nodes; and
    responsive to receiving the sufficient quantity of the plurality of data packets by the sink node, regenerating and decoding the plurality of data packets, wherein the sufficient quantity of the plurality of data packets comprises mixed data packets from at least two different flows.

9. The method of claim 8, further comprising, if the sufficient quantity of the plurality of data packets are received, combining multiple of the plurality of packets for retransmission.

10. The method of claim 8, wherein the inter-session network coding comprises cross-next-hop network coding.

11. The method of claim 8, further comprising, if the sufficient quantity of the plurality of data packets are received, regenerating the plurality of data packets using local encoding vectors.

12. The method of claim 11, further comprising, if the sufficient quantity of the plurality of data packets are received, regenerating a plurality of data packets of a forward flow and subsequently regenerating a plurality of data packets of a backward flow.

13. The method of claim 8, further comprising, if the sufficient quantity of the plurality of data packets are received, adding a new encoding vector to a header of each of the at least one of the plurality of data packets regenerated.

14. At least one computer-readable storage medium encoded with executable instructions that, when executed by at least one processor, cause the at least one processor to perform a method for increasing data throughput and decreasing transmission delay from a source node to a sink node via a relay node, the method comprising:
    receiving, from the source node, at least one of a plurality of data packets encoded by the at least one source node using fountain coding; and
    responsive to receiving a sufficient quantity of the plurality of data packets, regenerating, re-encoding, and relaying the plurality of data packets by the relay node, wherein the relay node (1) uses intra-session network coding to re-encode a first set of data packets from the sufficient quantity of the plurality of data packets in the same batch of the same session, and (2) uses inter-session network coding to re-encode a second set of data packets from the sufficient quantity of the plurality of data packets destined to different next-hop nodes; and
    responsive to receiving the sufficient quantity of the plurality of data packets by the sink node, regenerating and decoding the plurality of data packets, wherein the sufficient quantity of the plurality of data packets comprises mixed data packets from at least two different flows.

15. The at least one computer-readable storage medium of claim 14, the method further comprising, if the sufficient quantity of the plurality of data packets are received, combining multiple of the plurality of packets for retransmission.

16. The at least one computer-readable storage medium of claim 14, wherein the inter-session network coding comprises cross-next-hop network coding.

17. The at least one computer-readable storage medium of claim 14, the method further comprising, if the sufficient quantity of the plurality of data packets are received, regenerating the plurality of data packets using local encoding vectors.

18. The at least one computer-readable storage medium of claim 17, the method further comprising, if the sufficient quantity of the plurality of data packets are received, regenerating a plurality of data packets of a forward flow and subsequently regenerating a plurality of data packets of a backward flow.

19. The at least one computer-readable storage medium of claim 14, the method further comprising, if the sufficient quantity of the plurality of data packets are received, adding a new encoding vector to a header of each of the at least one of the plurality of data packets regenerated.

* * * * *

UNITED STATES PATENT AND TRADEMARK OFFICE
CERTIFICATE OF CORRECTION

PATENT NO. : 10,116,418 B2  
APPLICATION NO. : 15/501479  
DATED : October 30, 2018  
INVENTOR(S) : Wu et al.

Page 1 of 1

It is certified that error appears in the above-identified patent and that said Letters Patent is hereby corrected as shown below:

In the Claims

Column 28, Claim 14, Line 44:
Delete "at least one"

Column 28, Claim 14, Line 45:
Delete "and"

Signed and Sealed this
Twenty-fifth Day of December, 2018

Andrei Iancu
*Director of the United States Patent and Trademark Office*